(12) United States Patent
Peyne et al.

(10) Patent No.: US 7,157,415 B2
(45) Date of Patent: Jan. 2, 2007

(54) POST ETCH CLEANING COMPOSITION FOR DUAL DAMASCENE SYSTEM

(75) Inventors: Catherine M. Peyne, Hayward, CA (US); David J. Maloney, Livermore, CA (US); Shihying Lee, Fremont, CA (US); Wai Mun Lee, Fremont, CA (US); Leslie W. Arkless, Glasgow (GB)

(73) Assignee: EKC Technology, Inc., Hayward, CA (US)

( * ) Notice: Subject to any disclaimer, the term of this patent is extended or adjusted under 35 U.S.C. 154(b) by 0 days.

(21) Appl. No.: 10/007,134

(22) Filed: Dec. 4, 2001

(65) Prior Publication Data

US 2002/0134963 A1 Sep. 26, 2002

Related U.S. Application Data

(62) Division of application No. 09/343,532, filed on Jun. 30, 1999, now Pat. No. 6,417,112.

(60) Provisional application No. 60/092,024, filed on Jul. 6, 1998.

(51) Int. Cl.
*C23G 5/28* (2006.01)

(52) U.S. Cl. .......... 510/255; 510/176; 510/432; 510/435; 438/694; 257/E21.224; 257/E21.228

(58) Field of Classification Search ........ 438/738, 438/905, 906, 618, 694; 430/331; 510/176, 510/175, 254, 255, 432, 435; 257/E21.224, 257/E21.228
See application file for complete search history.

(56) References Cited

U.S. PATENT DOCUMENTS

| | | | |
|---|---|---|---|
| 5,209,858 A | 5/1993 | Heinshon et al. | 252/1 |
| 5,554,320 A | 9/1996 | Yianakopoulos | 252/389.23 |
| 5,560,857 A | 10/1996 | Sakon et al. | 510/175 |
| 5,739,579 A | 4/1998 | Chiang et al. | 257/635 |
| 5,766,668 A | 6/1998 | Brommelsiek et al. | 426/648 |
| 5,780,406 A | 7/1998 | Honda et al. | 510/175 |
| 5,783,495 A | 7/1998 | Li et al. | 438/738 |
| 5,798,323 A * | 8/1998 | Honda et al. | 510/176 |
| 5,817,572 A | 10/1998 | Chiang et al. | 438/624 |
| 5,846,695 A * | 12/1998 | Iwata et al. | 430/331 |
| 5,877,075 A | 3/1999 | Dai et al. | 438/597 |
| 5,891,799 A | 4/1999 | Tsui | 438/624 |
| 6,465,403 B1 * | 10/2002 | Skee | 510/175 |

FOREIGN PATENT DOCUMENTS

| | | |
|---|---|---|
| EP | 0 253 675 A1 | 1/1988 |
| EP | 0 773 480 A1 | 5/1997 |
| EP | 0 875 926 A1 | 11/1998 |
| WO | WO 99/60083 | 11/1999 |

* cited by examiner

*Primary Examiner*—George Fourson
*Assistant Examiner*—Julio J. Maldonado
(74) *Attorney, Agent, or Firm*—Morgan Lewis & Bockius LLP

(57) ABSTRACT

A new cleaning chemistry based on a choline compound, such as choline hydroxide, is provided in order to address the problem of dual damascene fabrication. An etch stop inorganic layer at the bottom of a dual damascene structure protects the underlying interconnect of copper and allows a better cleaning. A two step etch process utilizing the etch stop layer is used to achieve the requirements of ULSI manufacturing in a dual damascene structure.

6 Claims, 13 Drawing Sheets

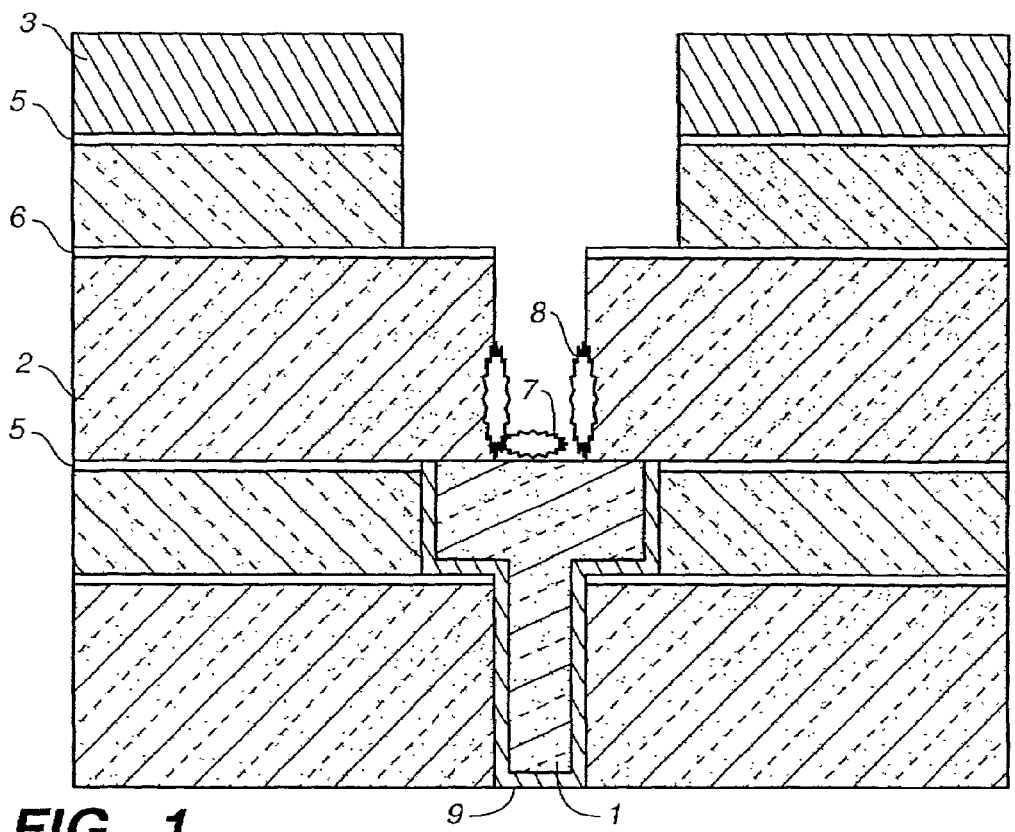
*FIG._1*
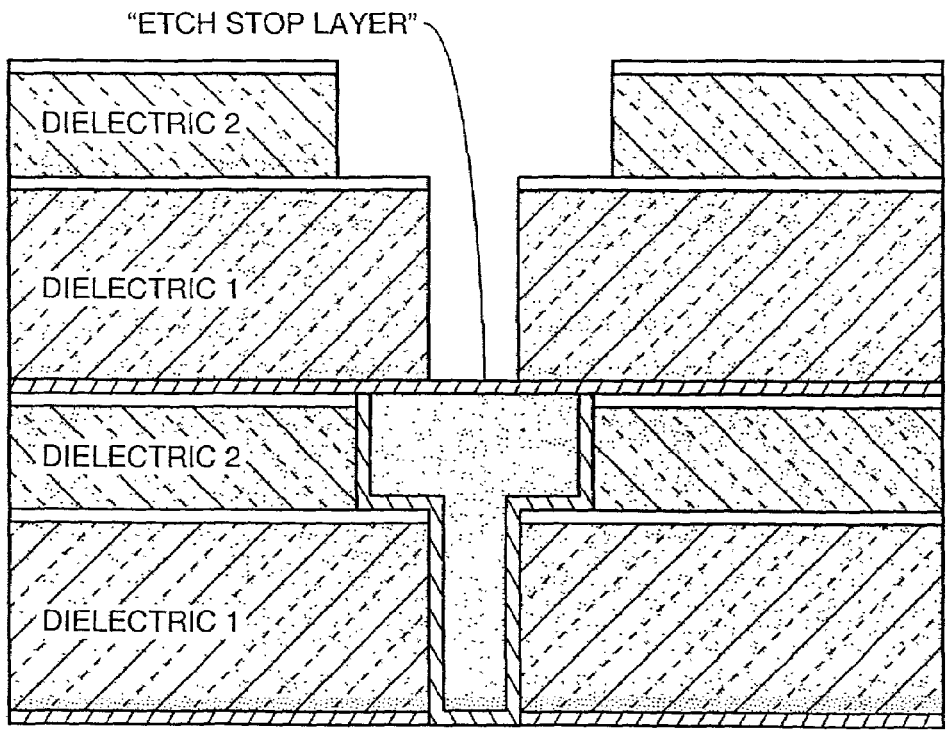
*FIG._2*

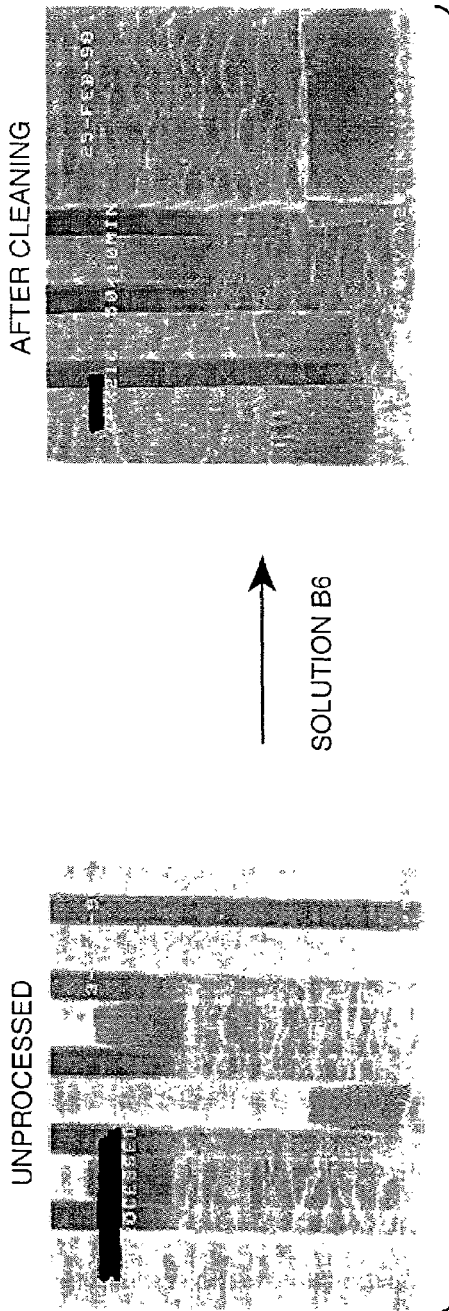
FIG._3A
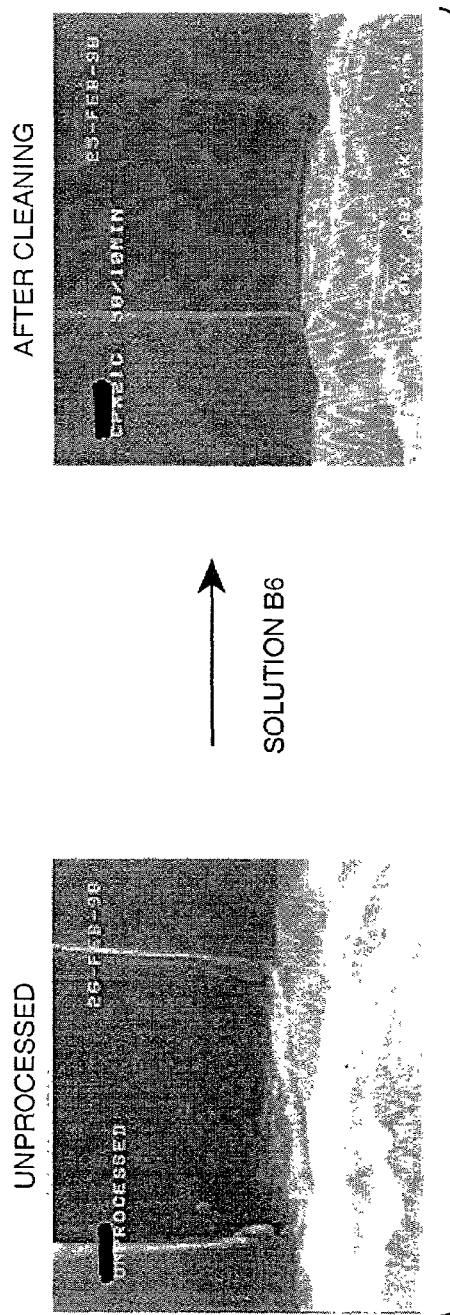
FIG._3B

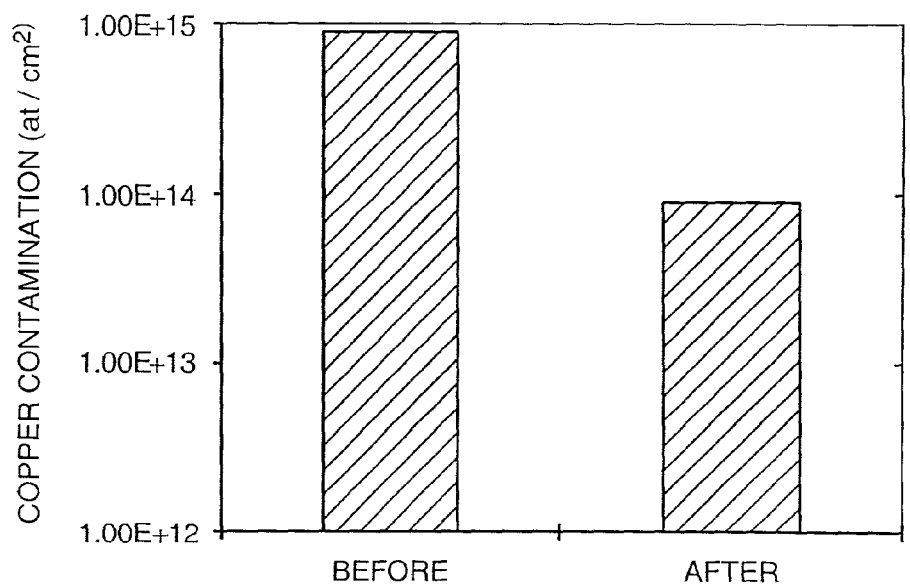
FIG._4
FIG._5
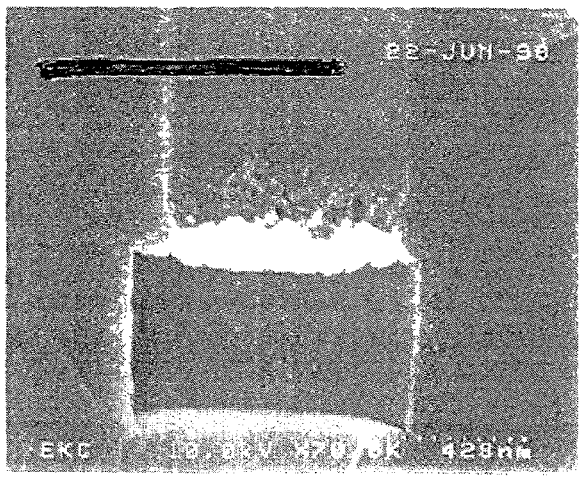
FIG._6

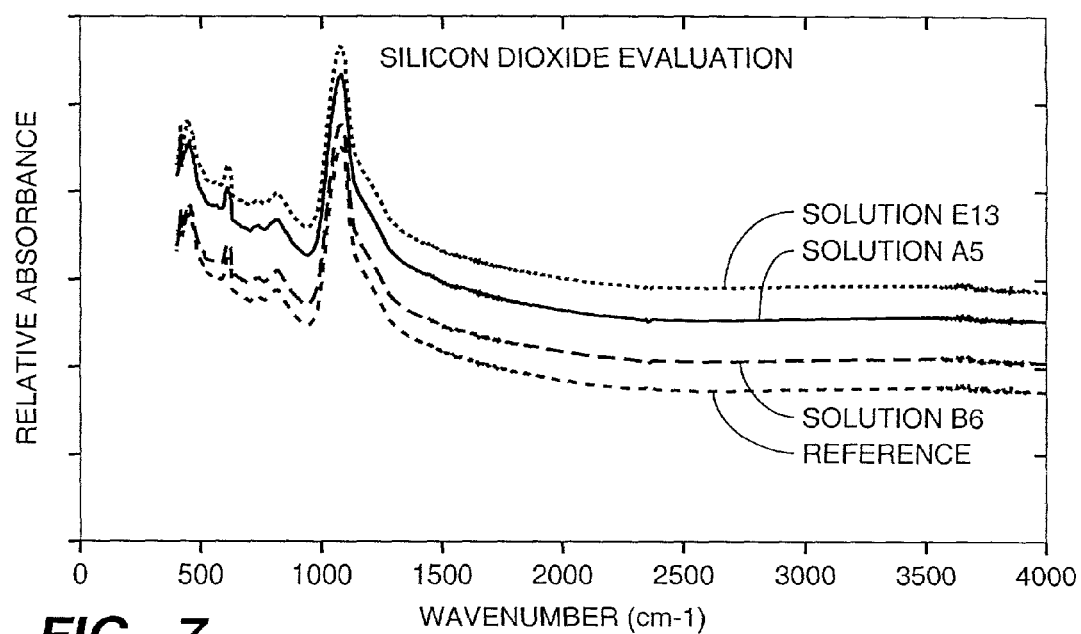
FIG._7
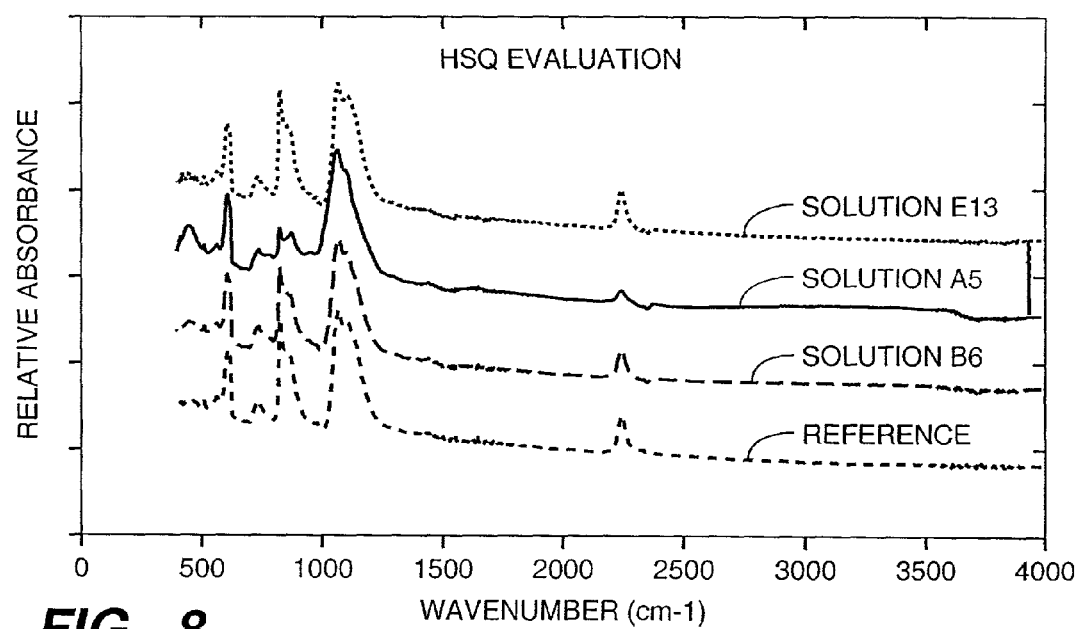
FIG._8

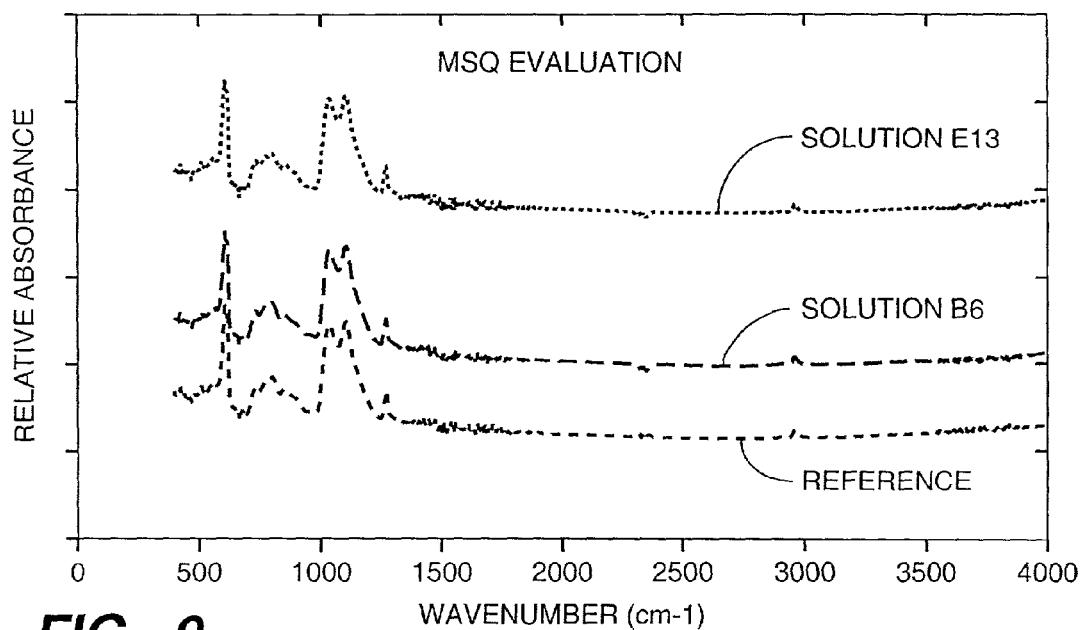
FIG._9
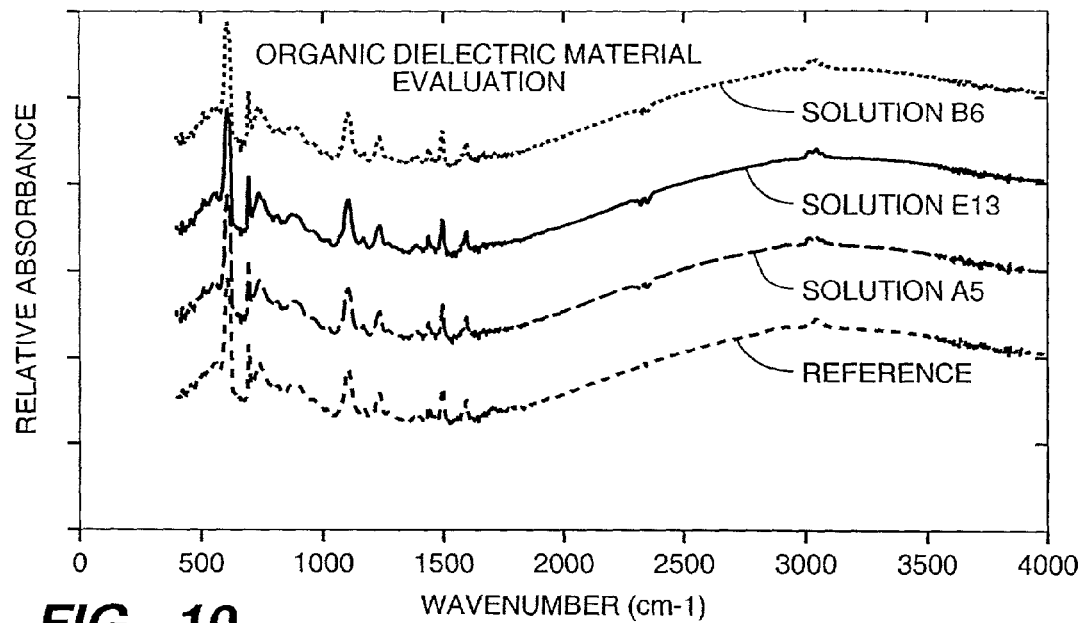
FIG._10

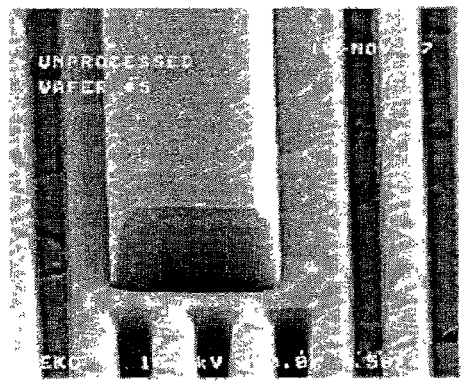
*FIG._11*
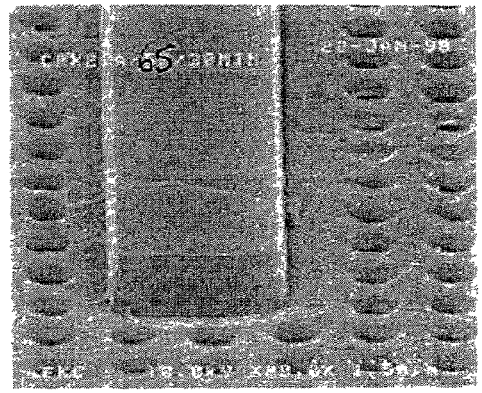
*FIG._12*
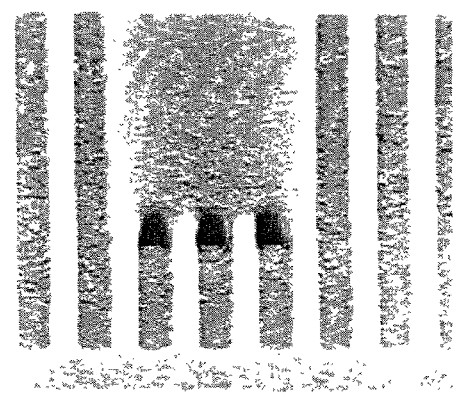
*FIG._13*
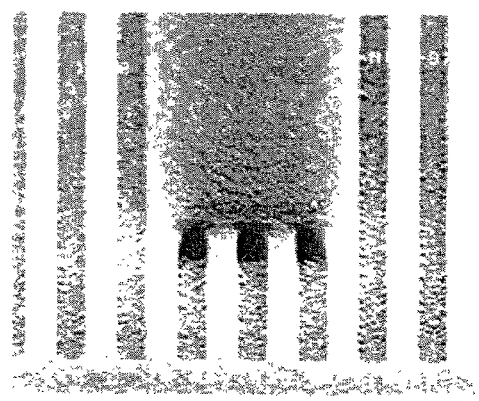
*FIG._14*
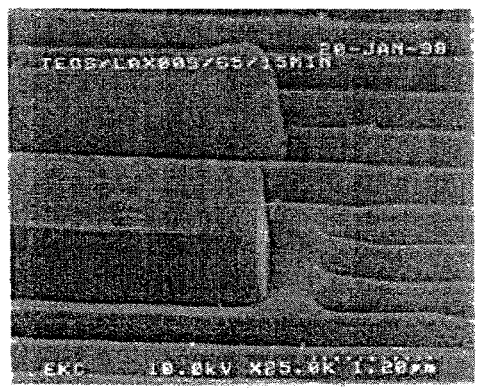
*FIG._15*
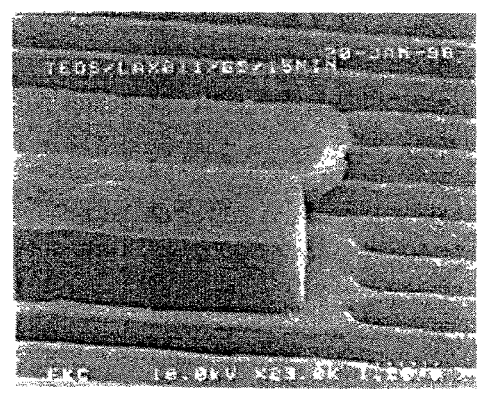
*FIG._16*

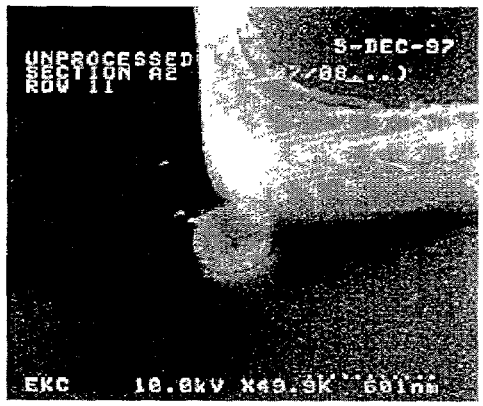
FIG._17
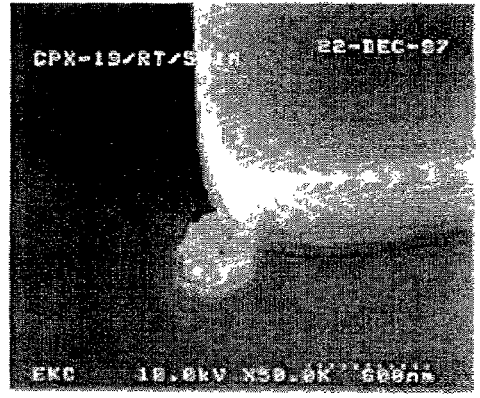
FIG._18
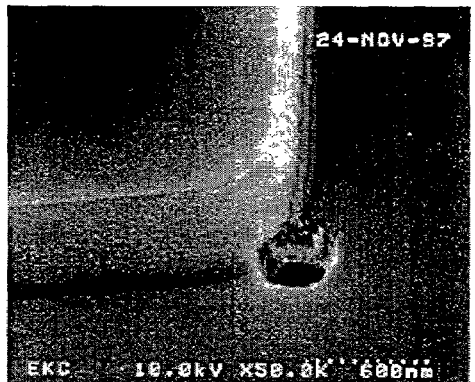
FIG._19
FIG._20
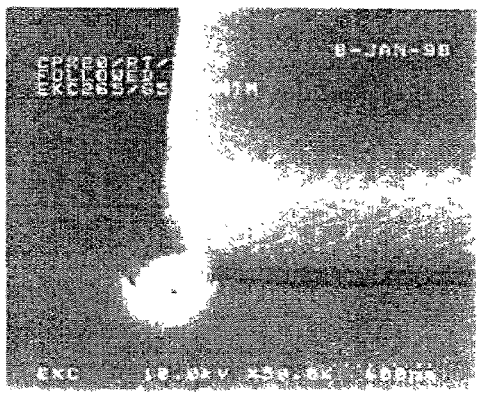
FIG._21
FIG._22

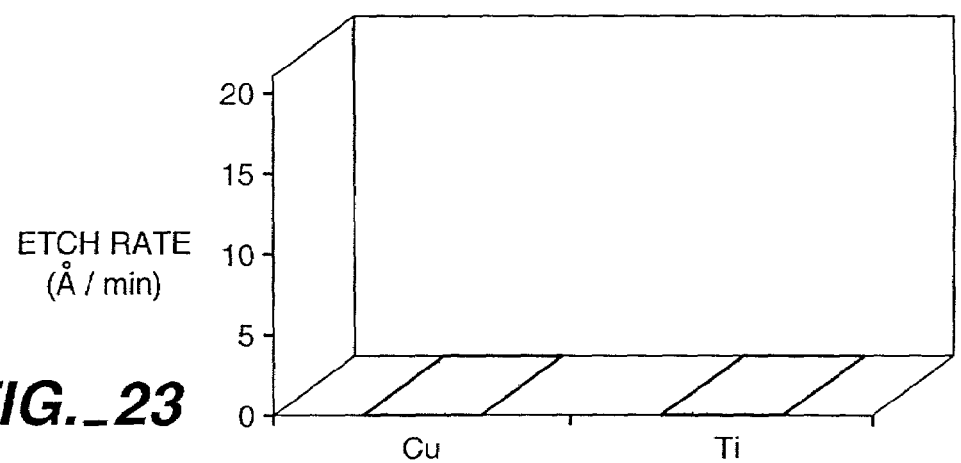
FIG._23
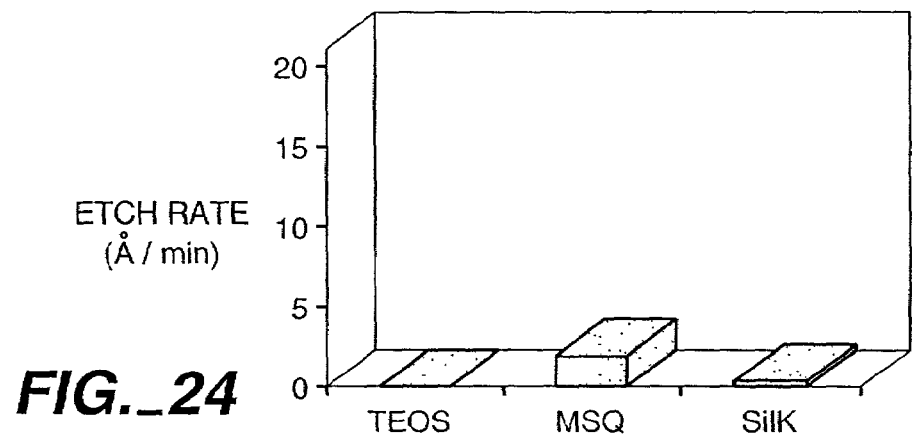
FIG._24

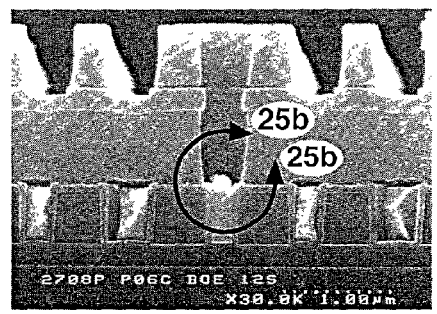
*FIG._25a*
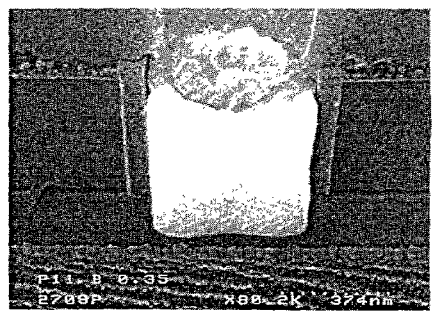
*FIG._25b*
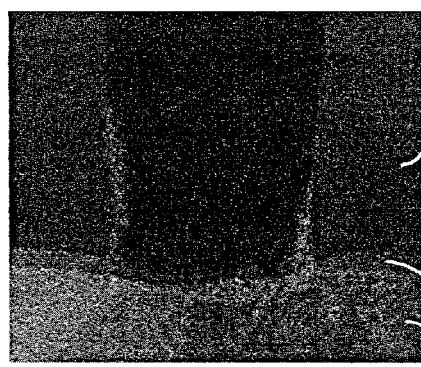
*FIG._26*
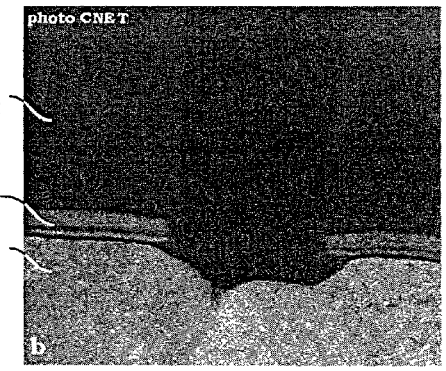
*FIG._27*
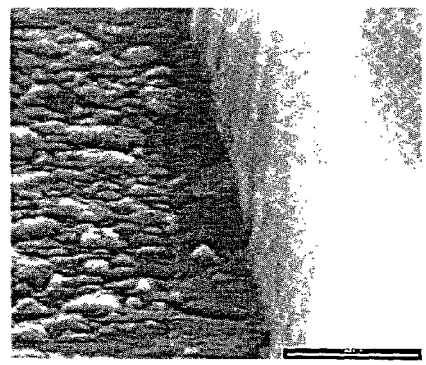
*FIG._28*
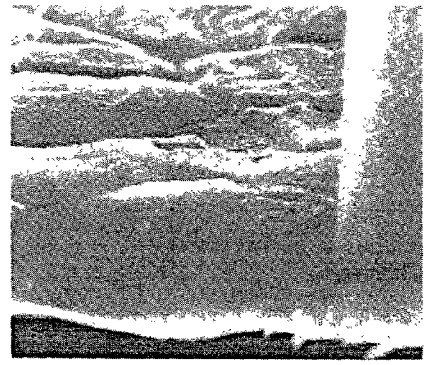
*FIG._29*

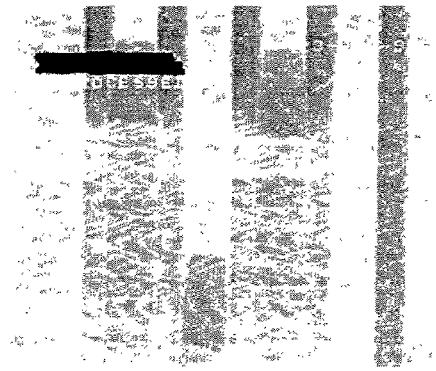
FIG._30
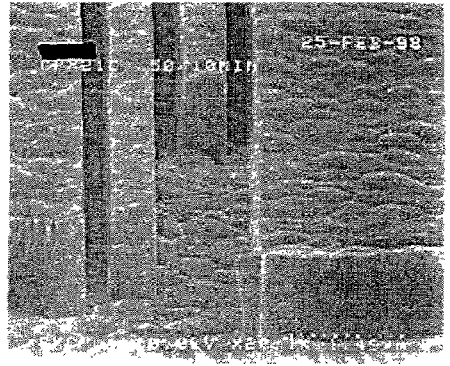
FIG._31
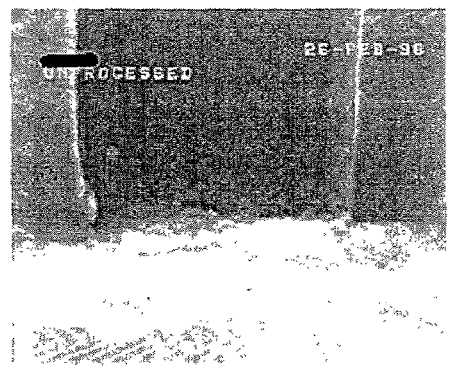
FIG._32
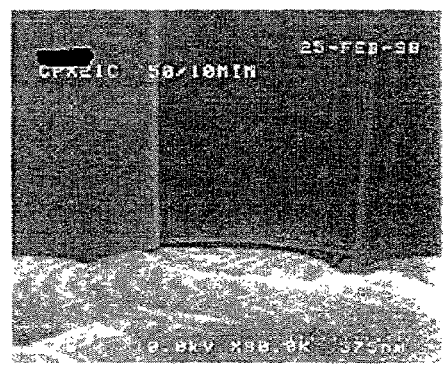
FIG._33
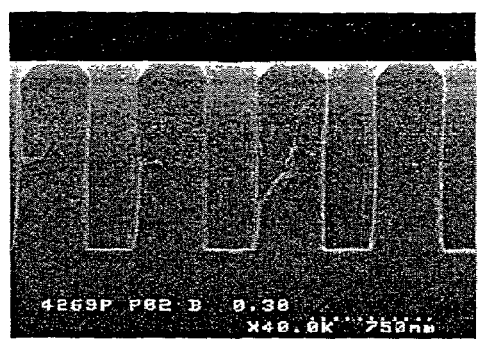
FIG._36
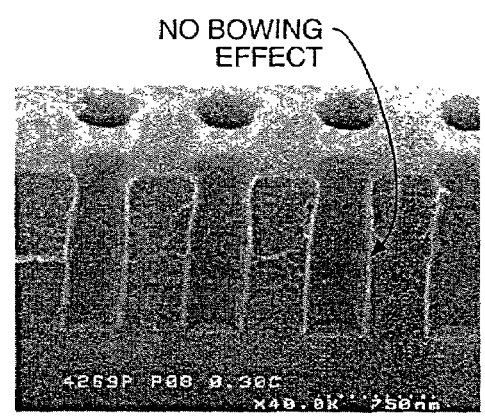
NO BOWING EFFECT
FIG._37

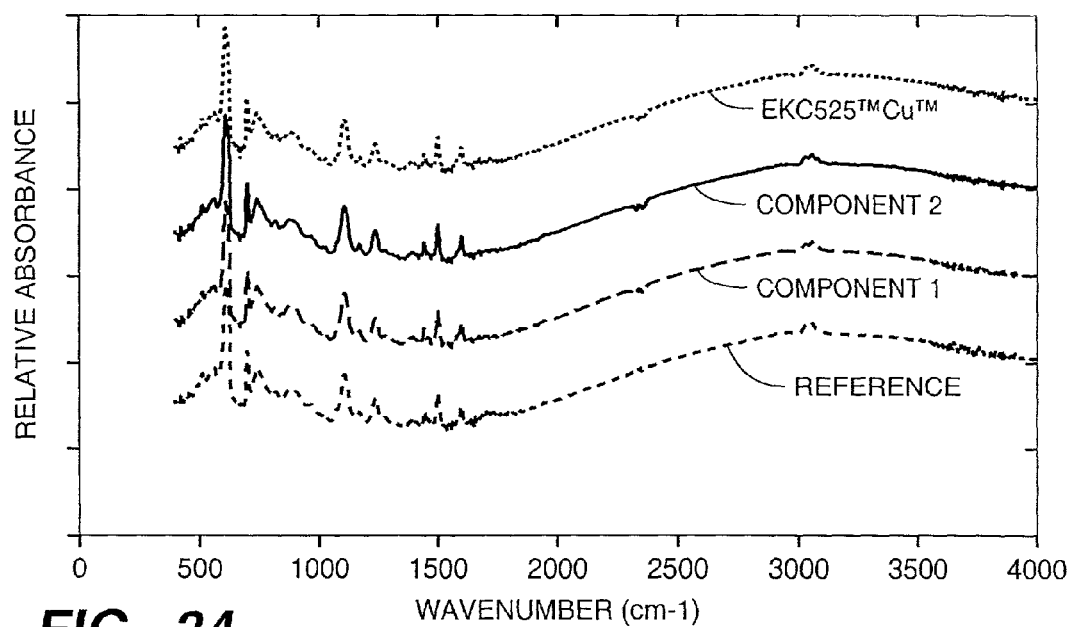
FIG._34
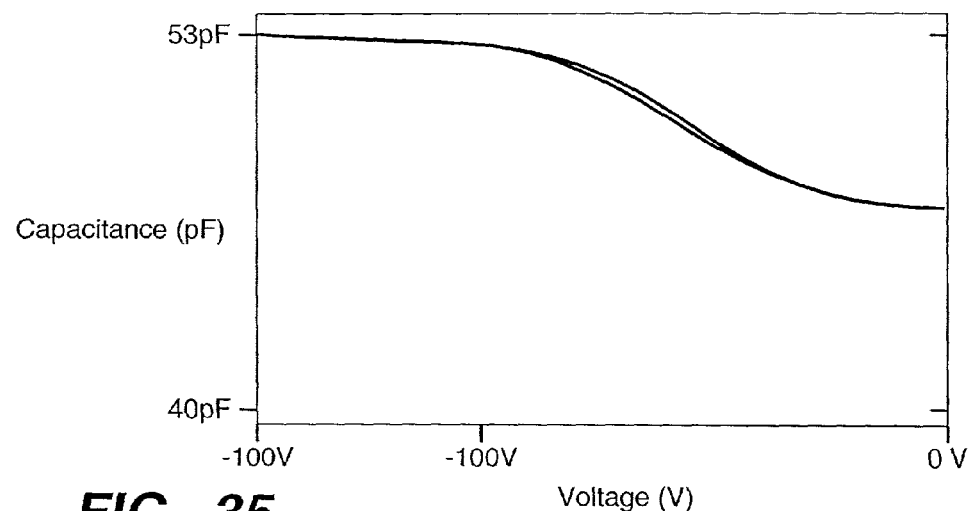
FIG._35

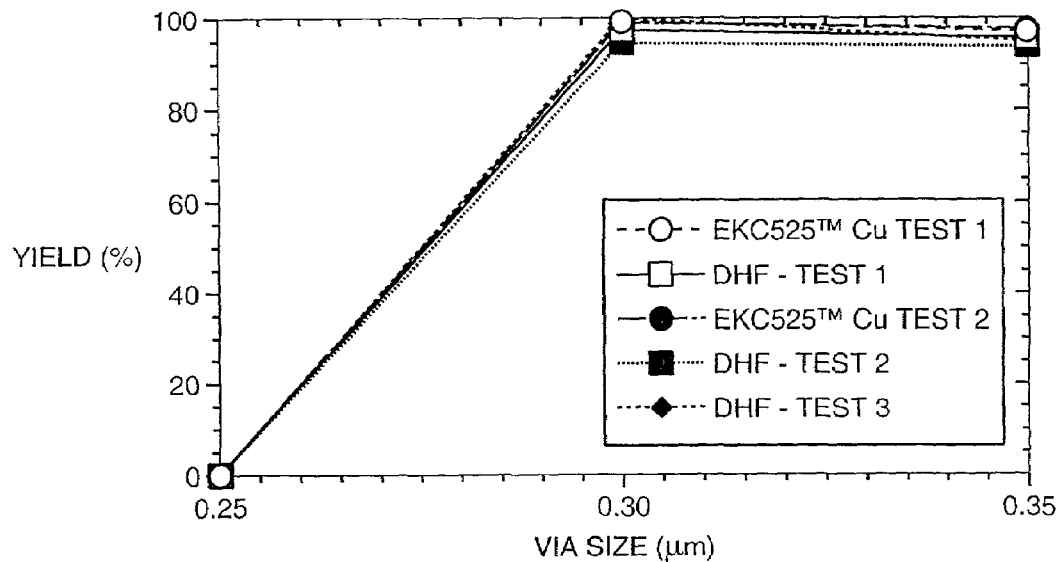
FIG._38 YIELD RESULTS ON COPPER TEOS STRUCTURE VERSUS VIA SIZE COMPARING DHF AND CLEANING SOLUTION
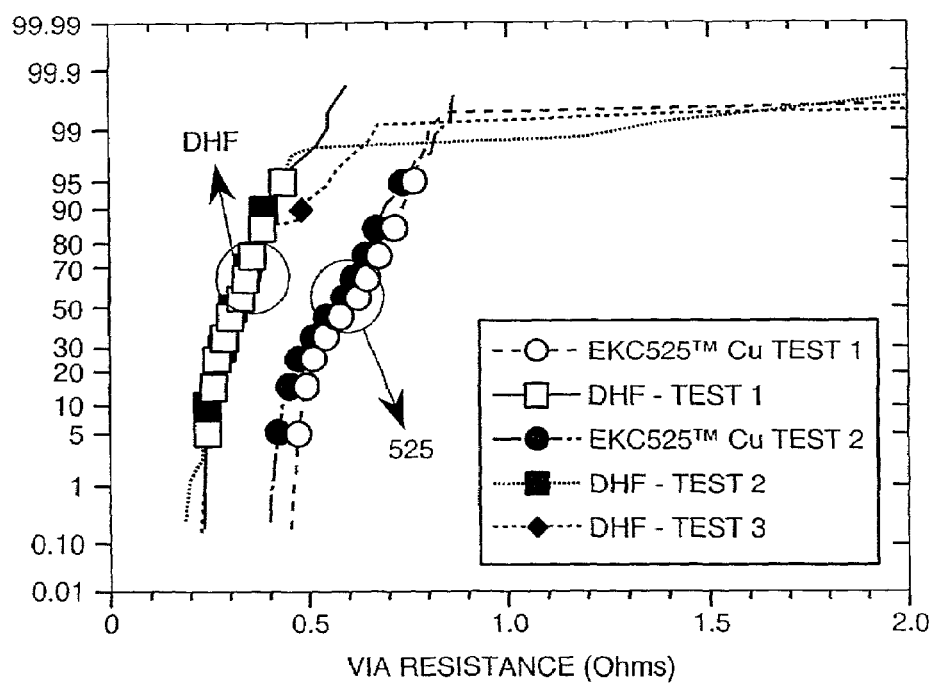
FIG._39 VIA RESISTANCE HISTOGRAM FOR 0.3 μm VIAS COMPARING DHF AND CLEANING SOLUTION

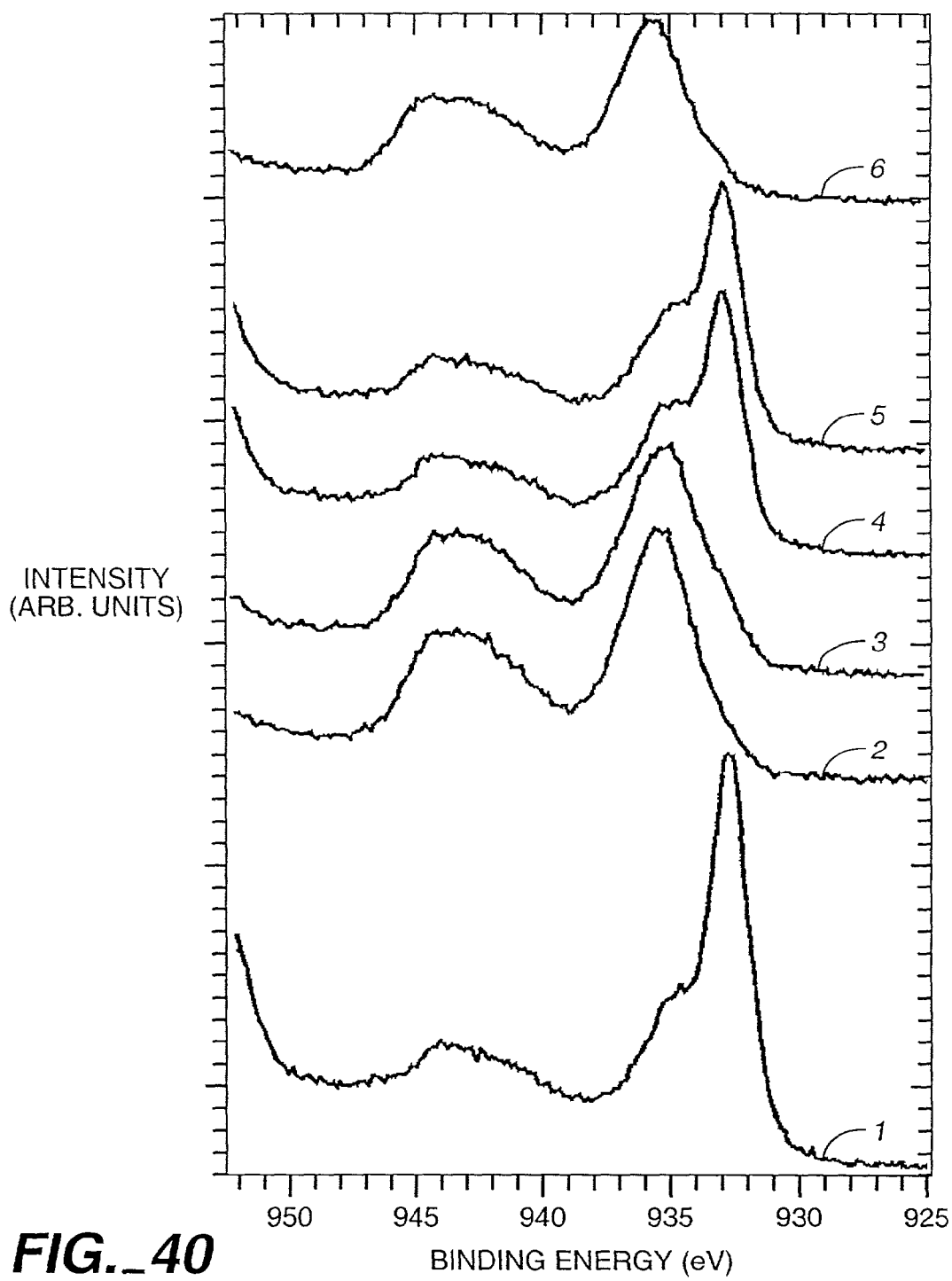
FIG._40
XPS ANALYSIS OF THE SURFACE COMPOSITION OF A COPPER BLANKET BEFORE (1), AFTER ETCHING (2 AND 3) AND AFTER CLEANING IN THE SOLUTION (4 AND 5) AND IN SOLUTION B8 (6).

POST ETCH CLEANING COMPOSITION FOR DUAL DAMASCENE SYSTEM

The present application is a divisional of U.S. application Ser. No. 09//343,532 filed Jun. 30, 1999, now U.S. Pat. No. 6,417,112, which claims priority under 35 USC 119(e) from provisional application Ser. No. 60/092,024 filed Jul. 6, 1998.

BACKGROUND OF THE INVENTION

1. Field of the Invention

The present invention relates generally to manufacture of semiconductor devices incorporating a metal interconnect. More specifically, it relates to a composition and process to clean post etch residues at an interconnect level, such as with a copper metallurgy, preferably incorporating a damascene/dual damascene structure. The invention further relates to a composition for other post etch residue-cleaning applications, such as aluminum, or aluminum alloy interconnects with misaligned tungsten plugs.

A key challenge in reduced geometry devices, such as 0.18 µm technology, is the interconnect RC delay time, which becomes the limiting factor of the device performance. This delay can be improved by combining low dielectric constant between tracks and the use of copper as a better conductor. This application is directed to solving some of the difficulties in integrating this type of interconnects, and a new strategy for the post dielectric etch cleaning process. The development of new cleaning chemistries and processes for their use, which are compatible with copper and low-k dielectric materials, is essential for process integration.

Since copper can not easily be dry etched, the use of damascene or dual damascene structures is becoming a key solution to realize this integration. With the appearance of new materials such as organic polymers for inter metal dielectric material, and the need to etch complex layers of dielectric materials, photoresist removal and cleaning steps require a new strategic approach.

2. Description of the Prior Art

During the fabrication of microcircuits, photoresist material is used to pattern, and transfer patterns onto the appropriate material. For example at interconnect levels the appropriate material will be either metal for electrically conducting paths or dielectric for isolating material in-between the conducting lines. Traditional interconnects are made of aluminum or aluminum alloys isolated by dielectric material, for example silicon dioxide.

More recently developed interconnects use copper as the conducting material and low-k dielectric material (a dielectric, having a dielectric constant $\in$ smaller than the dielectric constant of silicon dioxide). FIGS. 1 and 2 show a typical structure used in this case. To integrate copper and eventually aluminum, the pattern is transferred from the photoresist (3) through the dielectric (2). The gaps are then filled up by the conducting layer. This process is called damascene and can integrate either one level of interconnect only (single damascene) or both the horizontal interconnects and the vertical interconnects called vias (dual damascene). Vias always open atop the underlying metal lines (1) and good cleanliness of the via is required in order to minimize electrical resistance along the interconnect.

Various processes have been developed to build those structures, as disclosed, for example, in U.S. Pat. Nos. 5,739,579; 5,635,423; 5,705,430 and 5,686,354, which can include optional layers into the dielectric stack (5,6) but all those processes have in common:

that the via needs to be cleaned from all post etch residues (7 and 8), without damaging the metal, before the second metal layer can be deposited, that the whole dielectric material needs to be cleaned from copper compounds back-sputtered onto the sidewall and top surface (8) on the underlying copper during the final part of the etching, called "opening".

that the transfer of the wafer from the etching chamber to the ambient air for further processing creates oxidized copper compounds CuO or $Cu_2O$ that need to be cleaned to minimize the via resistance. IC manufacturing requires an excellent cleaning of copper residues, as copper diffuses very easily into silicon dioxide and other dielectric materials ultimately risking the creation of a failure ("killing" the device).

It has been described previously to clean materials used in the semiconductor industry by including a small amount (generally between 1% and 5% weight) of choline and other compounds to remove or avoid adsorption of metal impurities (U.S. Pat. Nos. 4,239,661, 4,339,340, PAJ 6,163,495, PAJ 6,041,773, PAJ 2,275,631, PAJ 1,191,450). Choline base is also well known for its use as developer of positive working photoresist (U.S. Pat. Nos. 4,294,911, 4,464,461). It has also been recognized that choline base can act as a etching agent of metal for thin film layer definition (PAJ 62,281,332, U.S. Pat. No.4,172,005) and that adding choline atoms into an etching chamber when etching copper helps to lower the process temperature and hence minimize copper oxidation. U.S. Pat. No. 5,846,695 discloses aqueous solutions of quaternary ammonium hydroxides, including choline, in combination with nucleophilic amines and sugar and/or sugar alcohols, for removal of photoresist and photoresist residues in integrated circuit fabrication.

The present invention is aimed at cleaning residues left after etching dielectric material and openings on a copper layer. Those residues can be minimal if the main etching residues and photoresist are cleaned before the final step of forming openings on copper, in which case we are dealing with residues due to the "opening" etch step only, e.g. copper rich residues on the bottom of the openings and copper back sputtered onto the dielectric material surfaces. But the residues become more complex if the "opening" etch is done directly after the main etch, in which case the post etch treatment is required to clean main etch residues (containing CFx, CHFx . . . ), to clean the bottom residues (containing Cu, CuO, $Cu0_2$), as well as the back sputtered copper. Additionally it is required that the post etch treatment remove photoresist.

Existing cleaning compositions used in the semiconductor industry are not suitable for the following reasons:

amine containing products are not compatible with copper and dissolve the metal at the exposed areas;

dilute hydrofluoric acid solutions (DHF) remove the sidewall polymer and CuO compounds by aggressively attacking the sidewall of the dielectric and hence change the designed dimensions of the device. Furthermore those solutions are ineffective for cleaning $Cu_2O$ or $CF_x$ compounds.

Optionally the photoresist might or might not be removed before the copper is exposed. Using traditional photoresist removal techniques is not ideal for the following reasons:

an oxygen plasma step will oxidize the copper to the CuO and $Cu_2$0 states, which will increase the via resistance, an oxygen plasma step will be detrimental to organic dielectric material, if used, by etching the material in an uncontrolled manner.

a traditional solvent used to remove photoresist such as, for example, products containing N-methyl pyrrolidone might require an extra cure step to recover the dielectric constant and properties of an organic dielectric.

The demand for faster devices has driven down the scale of the design rules. Today's 0.18 µm technology is reaching hole dimensions of 0.25 µm. Since the introduction of 0.25 µm technology we have seen that interconnects are becoming the limiting speed factor of the device due to interconnect resistivity as well as the RC delay induced by adjacent interconnects. A solution for lower resistance of the interconnects is to switch the interconnect metal from aluminum to copper.

Similarly, a solution for reduced capacitance between adjacent metal lines is to decrease the dielectric constant of the material in-between the lines. This can be achieved by the use of emerging new low-k materials.

Copper has been chosen because it is a relatively inexpensive metal with better conductivity($\rho=1.7$ $\Omega$.cm) than aluminum ($\rho=2.7$ $\Omega$.cm). However the main drawbacks of this material are first its high diffusivity into silicon, introducing risk of a killing defect in the front end device, and second the difficulty to dry etch it and integrate it in traditional processes. In addition, copper does not form an oxide passivation layer under ambient conditions (as aluminum does), making this metal very difficult to work with.

On the gap-fill side, the industry s choice of low-k dielectric material has not yet emerged, though various candidates have been suggested. It has been shown that a general trend to achieve lower dielectric constant is to use material with less silicon and more carbon. There is then a logical evolution from the inorganic materials (such as $SiO_2[\in=4]$, SiOF [$\in=3.5$]) to silsesquioxane types of material (such as HSQ, MSQ [$3.0<\in<3.5$]), towards organic material, such as benzyl cyclobutane (BCB) or silicon low k (SiLK) [$\in=2.7$]), with the ultimate low-k value being reached with air gaps.

The SIA Roadmap predicted the merging of the work done on the one hand with copper integration, and on the other hand with low-k materials, by the end of 1998. The strategy chosen here is the introduction of copper first followed by the transfer of the process to low-k material. However both projects are progressing together and a cleaning strategy has to be developed at this stage, taking into account the requirements of all the materials that will be used in the final process.

We have seen over the past few years, the emergence of the damascene type of structure in which the design is etched into a dielectric layer, which is then filled with conducting wires and planarized (FIG. 1). Dual damascene structures have the advantage of incorporating both lines and vias in one deposition step; this reduces the number of process steps and is therefore cost effective. However the main reason for the emergence of such structures nowadays is the fact that this is the easiest way to introduce copper.

Variations of the dual damascene structure exist, incorporating a series of layers for process purposes such as anti-reflective coatings, adhesion promoters, moisture barriers, diffusion barriers, polishing stops, buried etch mask and so on. The choice of whether those have to be used or not and what material ($SiO_xN_y$ or $Si_xN_y$) should be used for them often depend upon the final choice of the low-k material.

SUMMARY OF THE INVENTION

Accordingly, it is an object of this invention to provide a composition and process for cleaning post etch residues and copper containing polymeric residues formed when copper is exposed in semiconductor device manufacturing.

It is another object of the invention to provide such a cleaning composition and cleaning process which is compatible with copper and dielectric materials used in interconnects.

A further object of the invention is to provide such a cleaning composition and cleaning process which is compatible with most low-k dielectric materials, and does not substantially modify the FT-IR spectrum, dielectric constant, refractive index (RI) or thickness of such materials after use.

It is still another object of the invention to provide such a cleaning composition and cleaning process which will effectively clean residues on both sidewalls and tops of vias.

It is a still further object of the invention to provide such a cleaning composition and cleaning method that will effectively clean post etch residues from a via bottom.

In accordance with one aspect of the invention, it has been discovered that the traditional way of cleaning the dual damascene structure cannot be efficiently applied on this combination of materials. A "2 step etch process" can be used to achieve the requirement of ULSI manufacturing.

In accordance with another aspect of the invention, a new cleaning chemistry is provided in order to address the problem of dual damascene fabrication. This work starts with a wide screening of possible candidates compatible with copper and SiLK, the two main materials of interest in this aspect of the invention, resulting in the design of a new chemistry. This new cleaning chemistry is evaluated on damascene structures. This work is supported by scanning electron microscopy (SEM), transmission electron microscopy (TEM) and time-of-flight secondary ion mass spectrometry (TOF-SIMS) analyses on the features integrating copper, and by FT-IR and C(V) measurement for the integration of SiLK. In this aspect of the invention, a composition for removal of residues from integrated circuits comprises a choline compound, water and an organic solvent.

In accordance with another aspect of the invention, a process for the removal of a residue from an integrated circuit comprises contacting the integrated circuit with a composition comprising a choline compound, water and an organic solvent at a temperature and for a time sufficient to remove the residue from the integrated circuit.

In accordance with a further aspect of the invention, an etch stop inorganic layer at the bottom of the dual damascene structure protects the underlying interconnect of copper and allows us to proceed to a better cleaning. In this aspect of the invention, an integrated circuit fabrication process comprises forming a first silicon compound etch stop layer over a copper conducting line in the integrated circuit. A second silicon compound bulk dielectric is formed over the first silicon compound etch stop layer. The second silicon compound bulk dielectric is etched to expose the etch stop layer. Residues are removed from the integrated circuit. The etch stop layer is etched away to expose the copper conducting line. Residues are removed from the integrated circuit with a residue removal composition containing an effective amount of a choline compound.

BRIEF DESCRIPTION OF THE DRAWINGS

FIG. 1 is a cross section view of an example of a prior art dual damascene structure.

FIG. 2 is a cross section view of a modified dual damascene structure in accordance with the invention.

FIG. 3 is a set of scanning electron microscope (SEM) and TEM photographs showing results obtained with the invention.

FIG. 4 is a TOF-SIMS analysis showing a reduction of copper contamination in use of the invention.

FIGS. 5 and 6 are SEM photographs further showing results obtained with the invention.

FIGS. 7–10 are FT-IR spectra showing results obtained with the invention.

FIGS. 11–22 are SEM photographs further showing results obtained with the invention.

FIGS. 23–24 are graphs of results obtained with the invention.

FIGS. 25a–33 are SEM and TEM photographs further showing results obtained with the invention.

FIGS. 34–35 are graphs of results obtained with the invention.

FIGS. 36–37 are SEM photographs further showing results obtained with the invention.

FIGS. 38–39 are graphs of results obtained with the invention.

FIG. 40 shows results of x-ray photo spectroscopy (XPS) analyses obtained through use of the invention.

DETAILED DESCRIPTION OF THE INVENTION

In the composition and process of this invention, the choline compound can be in the hydroxide or salt form, such as choline hydroxide, choline bicarbonate or choline chloride. As used herein, the term "choline compound" also embraces related quaternary ammonium compounds, such as tetramethylammonium hydroxide (TMAH), tetrabutyl ammonium hydroxide (TBAH), their salts, and the like.

Suitable organic solvents in the composition and for practice of the process include such polar solvents as dimethyl sulfoxide, ethylene glycol, ethylene glycol alkyl ether, diethylene glycol alkyl ether, triethylene glycol alkyl ether, propylene glycol, propylene glycol alkyl ether, N-substituted pyrrolidone, ethylene diamine and ethylene triamine. Additional polar solvents as known in the art can also be used in the composition of the present invention.

Optionally, a corrosion inhibitor may be included in a formulation used to clean damascene structures with exposed copper present. The corrosion inhibitors are present to protect copper from being corroded, and may be chosen from a variety of classes of chemical compounds, including any compounds used for the prevention of copper corrosion in other systems comprising the art.

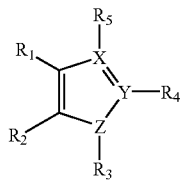

More specifically, compounds of the general class may be employed, where X, Y, and Z are chosen from C, N, O, S, and P. Under these conditions the valence requirements and presence of pendant R groups may be set appropriately. Pendant R groups R1–R5 may be chosen independently as H, optionally a substituted C1–C6 straight, branched or cyclo alkyl, alkenyl or alkynyl group, straight or branched alkoxy group, optionally a substituted acyl group, straight or branched alkoxy group, amidyl group, hydroxyl group, a halogen, carboxyl group, alkoxyalkyl group, alkylamino group, alkylsulfonyl group or sulfonic acid group; or the salt of such compounds. In a preferred embodiment X, Y and Z are nitrogen, nitrogen and carbon, respectively, and R1–R5 are hydrogen. In another preferred embodiment, X, Y and Z are nitrogen, R3 is hydrogen and R4 and R5 constitute a benzene ring.

Another class of copper corrosion inhibitors, the hydroxybenzenes, may be employed in the invention independently or in conjunction with the classes already cited herein. These comprise the general class

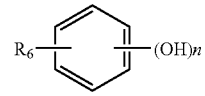

Wherein n=1–4, R6 may be present from 2–5 times and may be chosen independently as H, optionally a substituted C1–C6 straight, branched or cyclo alkyl, alkenyl or alkynyl group, straight or branched alkoxy group, optionally a substituted acyl group, straight or branched alkoxy group, amidyl group, a halogen, carboxyl group, alkoxyalkyl group, alkylamino group, alkylsulfonyl group or sulfonic acid group; or the salt of such compounds. Suitable specific examples of corrosion inhibitors include catechol, t-butyl catechol and benzotriazole.

The composition optionally contains hydroxylamine or a hydroxylamine salt. If present, the composition desirably contains from about 2 to about 12% by weight of the hydroxylamine or hydroxylamine salt.

In practice, the composition contains from about 10 percent by weight to about 50 percent by weight of the choline compound, from about 10 percent by weight to about 80 percent by weight of the water, and from about 20 percent by weight to about 80 percent by weight of the organic solvent. If present, the corrosion inhibitor is typically provided in an amount of from about 0.5 to about 5 percent by weight.

Because of its inability to create a passivation layer, traditional cleaning solvents are not well suited to work with copper as they usually contain aggressive complexing agents. A screening has been undertaken to evaluate new candidates to gently remove copper etch residues without damaging the existing interconnects. Etch rates on blanket copper were measured by sheet resistance measurement using a four point probe.

Some solvents, including hydroxylamine chemistries, show a severe incompatibility with copper. The incompatibility of Cu with hydroxylamine-containing chemistries is most likely a result of two factors: the known strength of hydroxylamine as a reducing agent, and its propensity (along with amine solvents and other chelating agents) to effectively complex and solubilize metal ions. Copper-containing etch residues in a high oxidation state ($Cu^{II}$) may be reduced and solubilized to $Cu^I$, then reoxidized by water or dissolved oxygen back to $Cu^{II}$ in an equilibrium process:

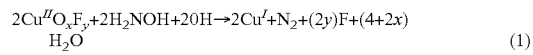

(1)

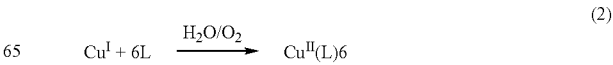

(2)

where L is an available ligand. Reaction 1 serves to assist in breaking up what is probably an amorphous, highly oxidized Cu residue of ill-defined stoichiometry, while (2) complexes the Cu, most likely oxidizing it back to $Cu^{II}$ (especially in the presence of water) in the process. At the same time, dissolved water and/or oxygen can oxidize native copper ($Cu^0$) to an oxidized form that can be dissolved by the strong complexing agents (including hydroxylamine) comprising an hydroxylamine-containing chemistry. What is important is to design a chemistry that is capable of dissolving oxidized Cu residues while shutting down the thermodynamic drive that thaws native Cu into solution; this is accomplished through judicious change of the ionic medium employed.

$$Cu^0 \xrightarrow{prevent} Cu^I, Cu^{II} \quad (3)$$

1. Cleaning of Damascene Type Structures Integrating Copper

The main purpose of this invention is to clean damascene type structures when copper is exposed. In the first example presented here (FIG. 3), the sample is a blanket copper with a single layer of TEOS (silicon dioxide type of dielectric) etched. The etch has been realized in two steps: first the main etch through the bulk dielectric, followed by a cleaning step where photoresist and main post etch residues are removed into conventional solvent while copper is still protected by a thin nitride layer; then a second short etch is realized to open the structure to copper, leaving a minimum of residues on the bottom and sidewall of the structure.

A solution of choline hydroxide (solution B6) was used to successfully clean those residues at 50° C. for 10 mm (FIG. 3).

XPS (X-Ray Photo Spectroscopy) analysis of such a structure shows the effect of the invention at removing CuO and $CuO_2$ compounds (FIG. 4).

Table I summarizes various compositions used to clean such a structure, and their result on the cleaning efficiency and copper attack at the bottom of the structure. Results are rated from 0 to 10 by subjectively analyzing SEM pictures. A 0 rating means bad and 10 is good. However we note that if cleaning is bad, corrosion inhibition is usually good only because the residues protect the copper material. This is for example the case of pure water (A1).

From solutions A1, A2, A3, A4, and A5 we observe that cleaning efficiency increases when choline concentration reaches 20%. However we note that such concentration creates a thin foam at the surface of the solution and that adding a solvent such as, for example, propylene glycol, reduce this foaming effect without reducing the cleaning efficiency (solutions B1, B2, B3, B4, B5 and B6). This foaming effect however is reduced depending upon the type of stabilizer used with the raw material of choline hydroxide, and if the raw material is chosen correctly, the solution might not require an additional solvent.

We have investigated the process conditions for those cleaning solutions and found better results at temperatures below 50° C. The time does not appear to be important and we would recommend a process time between 10 and 30 minutes depending upon the difficulty of removing the residues.

Alternatively the use of other quaternary ammonium systems such as TMAH (Tetramethyl ammonium hydroxide), or TBAH (Tetrabutyl ammonium hydroxide) can have satisfactory results on the cleaning of such structures.

TABLE 1

Result on Post Etch Residues cleaning and copper attack for various solutions (scored 0: bad to 10: good)

| Solution | Op. Temp. | Op. time | Cleaning efficiency | Copper corrosion |
|---|---|---|---|---|
| A1 | 80 | 15 | 0 | 10 |
| E7 | 80 | 30 | 0 | 5 |
| E36 | 70 | 10 | 7 | 10 |
| D21 | 45 | 10 | 10? | 10? |
| D11 | 50 | 10 | 7 | 10 |
| D12 | 50 | 10 | 9 | 10 |
| D8 | 70 | 10 | 9 | 5 |
| D10 | 45 | 10 | 5 | 5 |
| D8 | 50 | 10 | 5? | 5 |
| D22 | 45 | 15 | 7 | 10 |
| D23 | 45 | 15 | 2–5 | 10 |
| D24 | 45 | 15 | 0–2 | 10 |
| D25 | 45 | 15 | 0 | 10 |
| D13 | 45 | 15 | 7 | 10 |
| D14 | 45 | 15 | 0–2 | 5 |
| D15 | 45 | 15 | 0 | 10 |
| D16 | 45 | 15 | 9 | 9 |
| D17 | 45 | 15 | 7 | 10 |
| D18 | 45 | 15 | 2–5 | 10 |
| B6 | 50 | 10 | 10 | 9 |
| A2 | 50 | 10 | 7 | 2 |
| A3 | 50 | 10 | 5 | 2 |
| A4 | 50 | 10 | 10 | 9 |
| A5 | 50 | 10 | 9 | 10 |
| B1 | 25 | 5 | 7 | 9 |
| B1 | 75 | 5 | 9 | 9 |
| B1 | 75 | 25 | 7 | 10 |
| B2 | 25 | 5 | 5 | 10 |
| B2 | 75 | 5 | 5 | 10 |
| B2 | 75 | 25 | 5–7 | 7 |
| B3 | 25 | 5 | 0 | 10 |
| B3 | 75 | 5 | 5 | 10 |
| B3 | 75 | 25 | 5 | 10 |
| B4 | 25 | 5 | 2–5 | 10 |
| B4 | 75 | 25 | 2–5 | 10 |
| B5 | 25 | 5 | 0 | 10 |
| B5 | 75 | 5 | 7–9 | 10 |
| B5 | 75 | 25 | 7–9 | 10 |
| B5 | 50 | 10 | 10 | 9 |
| B6 | 25 | 5 | 9 | 10 |
| B6 | 75 | 5 | 7 | 10 |
| B6 | 75 | 25 | 7 | 10 |
| C6 | 50 | 10 | 7 | 5 |
| C1 | 50 | 10 | 7 | 9 |
| C2 | 50 | 10 | 7 | 7 |
| C3 | 50 | 10 | 7 | 5 |
| C4 | 50 | 10 | 7–9 | 9 |
| C8 | 50 | 10 | 7 | 5 |
| C9 | 50 | 10 | 7 | 7 |
| C10 | 50 | 10 | 5 | 10 |

In our second example the structure has been etched in one step directly opening on copper. FIG. 5 shows the example of residue found at the bottom of the structure. FIG. 6 shows that the invention was not able to clean such a residue under the conditions employed.

Dual damascene structures have the advantage of reducing process steps for interconnect manufacture. Hence, process engineers research the simplest structure possible in order to preserve this cost advantage. Also, the introduction of too many layers participates in the increase of the global dielectric constant of inter-metal dielectric materials. This increase can be as high as 20%, in which case the benefits earned by using a new dielectric material are lost.

The simplest structure, the first approach tested, consisted of etching both lines and via levels down to the underlying copper. In this example a buried hard mask is included and used to pattern the via level, while photoresist was used to pattern the line level.

A typical example is shown in FIG. 25, where the opening on copper forms some "mushroom"-type residues.

The high aspect ratio of such a structure, the wafer non uniformity of the etch, and etch lag all demand a minimum overetch of the structure into the copper, resulting in two main issues that need to be addressed: firstly, copper is back sputtered all over the structure (sidewalls and top), likely to diffuse later into the dielectric material and eventually reach the front end device; and secondly, post etch residues created in this case are more difficult to remove. They are very strongly anchored to the wall, and have a complex composition (Cu, CuO, $Cu_2O$, silicon from the dielectric, carbon from the photoresist, fluoride species from the etching gases, etc.).

Various traditional cleaning treatments were tested on these residues, and failed to give satisfactory results. Therefore, from a process integration standpoint, the use of a one-step etch opening directly on copper is not ideal.

One of the strategies chosen in this work was the introduction of a thin $Si_xN_y$ layer at the bottom of the structure, which is used as an etch stop for the main etch step. This permits photoresist removal while isolating the etch residues generated from the dielectric etch from those generated from opening on copper.

At the same time, photoresist removal can proceed in the absence of exposed copper. Here again, the weakness of the natural copper oxide layer makes the photoresist removal step an issue. Indeed, traditional methods of photoresist stripping (such as plasma $O_2$) will in most cases oxidize and attack the metal.

Lithography was performed on the DUV 248 nm ASML/ 90 stepper and damascene structures are etched on the TEL Unity 85 DRM. The photoresist was removed by a combination of downstream oxygen and forming gas plasma (IPC Branson 3500L) followed by a copper compatible product, to compensate for the possibility of premature punch-through of the $Si_xN_y$ layer. Posistrip®EKC®LE is used in WSST 640 from SEMITOOL at 60° C. for 15 minutes.

The remaining residues are now easier to remove. However, an issue still remains with back sputtered copper on the sidewall of the structure, because in the second etch step copper is exposed. At this stage the generated residue contains a large quantity of copper, which can be removed as discussed above. As shown in the TEM picture in FIG. 26, the final etch back-sputters a large amount of copper residue on the sidewalls and top of the structure. This contamination has to be removed before the next metallization step; otherwise, it will be trapped under the diffusion barrier.

Various papers report the use of dilute HF solutions to clean these types of residues. The ability of these solutions to clean is well known for front end processing, but shows some disadvantages at the interconnect level, in that cleaning proceeds through attack of the dielectric and results in a loss in critical dimensions. It has also been reported that these solutions are not effective in removing $Cu_2O$ types of residues.

The samples used in this study are composed of a blanket layer of CVD copper, with a single damascene of TEOS. Solution B6 is used at 50° C. for 10 min in a SEMITOOL to remove these residues.

The TEM cross section (FIG. 27) shows the cleaning efficiency of solution B6 at the bottom of the via and on the sidewalls. A slight attack of the metal at the bottom of the via is due the ability of the chemistry to remove damaged or oxidized copper. During opening of the via on copper, there is not only some copper backsputtered onto the sidewall but also the structure of the exposed copper is mechanically changed (hammer-hardened) by the etching. It is necessary to remove this transformed material, which would increase the via resistance. The resulting shape of the material is not a problem as the lateral attack is lower than 50 nm and the via will next be filled by fresh copper.

A TOF-SIMS analysis on the top of the surface shows the quantitative reduction of copper contamination from $9 \times 10^{14}$ atoms/cm2 before cleaning to $9 \times 10^{13}$ atoms/cm2 after use of solution B6. The detection limit of the equipment is about $10^{12}$ atoms/cm2.

Furthermore, a blanket silicon wafer is introduced in the SEMITOOL during processing as a control for copper contamination. The contamination of the native oxide of this wafer is analyzed by vapor phase decomposition total reflection x-ray fluorescence (VPD-TXRF), and shows that not only does the chemistry remove copper contamination but also does not redeposit this contamination elsewhere.

FIGS. 28–33 demonstrate the cleaning efficiency of solution B6 on large areas of exposed copper (FIGS. 28–29), trenches (30–31), and holes (32–33). We note that an artifact due to sample cross sectioning breaks some TEOS lines which allows a comparison between the copper exposed to the etch process and that which was protected by the dielectric. This shows that solution B6 effectively cleans the residues, with no global attack of the copper (as demonstrated in FIG. 23), but the gentle action of the product is shown by the clear definition of the grain boundaries.

FIGS. 38 and 39 show electrical results on an integrated circuit with 2 levels of copper. Via resistance is a measure of the cleaning efficiency at the contact between the 2 layers. The via resistance after cleaning with solution B6 corresponds to the theoretical via resistance, which proves a good cleaning with the via dimension being respected.

FIG. 40 shows the efficiency of solution B6 to reduce post etch residues. Curve (1) shows the composition of the blanket copper in ambient air, with a high peak intensity at 932.5 eV. for $Cu_2O$. Curves (2) and (3) show the composition of the blanket copper after an $O_2/N_2$ plasma etch for 34 sec. and 68 sec. respectively. The residues consist of CuO detected at 935 eV. Curves (4) and (5) show the composition of the blanket copper surface after processing through plasma etch, followed by cleaning in solution B6 for 2 min. and 20 min., respectively. This shows a reduction of the CuO residues to a less oxidized state.

2. Etch Rates

The main purpose of this invention is to clean damascene type structures when copper is exposed. For this reason a series of solvents were tested for compatibility with copper. Etch rates on metals are measured by using a four point probe on blanket sample, measuring the evolution in sheet resistance of the material versus time processed into the solution. The resultant etch rates are converted into Angstrom per minute (Å/min), as in table 2.

It is shown that choline solutions (for example solutions A5, D19, or D3) are compatible with copper material and will not attack the copper material when it is exposed to the solution during cleaning.

The concentration of choline hydroxide has been varied from 10% to 50% with added solvent, e.g., propylene glycol varying from 0% (solution A5) to 50% (solutions B6, C2, C4) and show good compatibility with copper (table 2).

The invention shows good compatibility with most low-k dielectric materials used in integrated circuit fabrication. Compatibility with dielectric materials is evaluated by the two following methods:

thickness measurement by ellipsometry (table 3);

material characteristic by FT-IR (Fourier transform infra red) (FIGS. 7 to 10)

As above in the case of metal, thickness evolution is evaluated versus time of processing in the solution, and results are given in Å/min. (Table 4). FT-IR spectra of the processed material are compared to the initial spectrum in order to detect any structural or chemical change in the material.

Materials tested were silicon dioxide (TEOS), hydrogen-silsesquioxane (HSQ), methyl silsesquioxane (MSQ) and organic dielectric, in solutions of choline hydroxide 50% (A5), propylene glycol 100% (E13), and mixtures of both (solution B6) (FIGS. 7–10).

We observe good compatibility between these solutions and TEOS, MSQ, and organic dielectric. The FT-IR of HSQ however shows a slight absorption of moisture (around 3500 $cm^{-1}$) which correlate to our observation of spots in the material. We anticipate a lift-off of this material if a patterned sample is processed in these solutions.

A C(V) curve measures the capacitance of a structure composed of metal/dielectric/silicon versus voltage. It gives an indication of the dielectric under stress conditions. FIG. 35 shows that processing with solution B6 does not change the properties of an organic dielectric material and that no hysteresis is induced.

These results show that the invention is compatible with most materials used to integrate copper in modern interconnects.

TABLE 2 etch rate on copper of various solvents

|  | test temp. | Test 1 dT/dt (Å/min) | Test 2 dT/dt (Å/min) | Test 3 dT/dt (Å/min) |
| --- | --- | --- | --- | --- |
| A5 | 80 | 2.79 |  | 0.8 |
| D19 | 80 | 2.86 |  |  |
| D3 | 80 | 9.81 |  |  |
| E1 | 80 | −3.36 |  | 0 |
| E2 | 80 | 4.75 |  | 6.7 |
| E3 | 80 | −3.24 |  |  |
| E4 | 80 | 7.71 |  | 17 |
| E5 | 80 | 44.95 |  | 9 |
| E6 | 80 | 4.11 |  |  |
| E7 | 80 | 39.65 | 74.47 | 54 |
| E8 | 80 | 1.34 | −5.23 | 1.1 |
| E9 | 80 | −2.32 |  |  |
| E10 | 80 | −1.21 |  |  |
| E11 | 80 | −2.50 | −2.82 |  |
| E12 | 80 | −15.77 |  |  |
| E13 | 80 | −0.83 |  | −1.4 |
| E14 | 80 | 23.01 | −1.68 |  |
| E15 | 80 | −0.97 |  |  |
| E16 | 80 | 0.84 |  |  |
| E17 | 80 | 28.65 |  |  |
| E20 | 80 | 6.30 |  |  |
| E21 | 80 | −58.32 |  |  |
| E22 | 80 | 0.15 |  |  |
| E23 | 80 | 0.82 |  |  |
| E24 | 80 | −2.36 |  |  |
| E27 | 80 | 6.03 |  |  |
| E28 | 80 | −0.80 |  |  |
| E29 | 80 | 25.90 |  |  |
| E30 | 80 | 4.17 |  |  |
| E31 | 80 | −40.15 |  |  |
| E34 | 80 | 8.69 |  |  |
| E35 | 80 | 7.45 |  |  |
| A5 | 45 | 0.8 |  |  |
| B5 | 45 | 0 |  |  |
| B6 | 45 | 0.3 |  |  |
| C1 | 45 | 0 |  |  |
| C2 | 45 | 13 |  |  |
| C3 | 45 | 8 |  |  |
| C6 | 45 | 0.7 |  |  |
| C8 | 45 | 6 |  |  |

TABLE 2-continued etch rate on copper of various solvents

|  | test temp. | Test 1 dT/dt (Å/min) | Test 2 dT/dt (Å/min) | Test 3 dT/dt (Å/min) |
| --- | --- | --- | --- | --- |
| C9 | 45 | 0 |  |  |
| C10 | 45 | 6 |  |  |

TABLE 3

Etch rates on dielectric materials and metals for selected solutions.

| | Dielectric Materials | | | | Metals | |
| # | TEOS | HSQ | MSQ | SiLK | Cu | Ti |
| --- | --- | --- | --- | --- | --- | --- |
| E8 | 0.0 | 4.0 | −0.3 | −23.7 | 1.1 |  |
| E1 | ? | 5.3 | −1.9 | −15.4 | 0.0 |  |
| E2 | 0.0 | 4.8 | −1.0 | 0.2 | 6.7 |  |
| E4 | 0.9 | 6.4 | 10.5 | −0.9 | 17.0 |  |
| E7 | 0? | ? | 0.6 |  | 53.5 |  |
| E5 | 2.4 | 9.2 | −2.3 |  | 9.0 |  |
| B6 | −0.4 | Spots/liftoff | 1.9 | 0.3 | −3.6 | 0 |
| A5 | −0.4 | 0? | 9.5 | −1.4 | 0.8 |  |
| E13 | 0.3 | 1.7 | 1.0 | −0.1 | −1.4 |  |

This new chemistry has been developed in order to be compatible with low-k dielectric materials. Because of the introduction of SiLK, special efforts were made to study the particular compatibility of solution B6 with this material. FIG. 34 shows the FT-IR spectrum of the material as deposited (reference), and after treatment in solution B6 (processed at 50° C. for an extended period of 30 minutes). As shown in the graph, no structural change of the material through processing is observed.

Similarly, the change in the dielectric constant of SiLK was followed by the mercury probe method. The mercury probe measures the capacitance of the dielectric between a mercury droplet and the bulk silicon. The dielectric constant is calculated from the equation:

$$C_{ox} = e_o e_r A/t,$$

in which:

$C_{ox}$=measured capacitance,
$e_o$=dielectric constant of vacuum,
$e_r$=real dielectric constant [or k],
A=surface area of the mercury droplet,
t=thickness of the dielectric.

After processing in solution B6 there is no noticeable change in the dielectric constant from its initial value of 2.7.

By sweeping the voltage, the C(V) curve gives an indication of the behavior of the dielectric under stress conditions. The C(V) curve in FIG. 35 shows that the material is not modified, as no hysteresis is induced in the material by processing in solution B6.

Tests on patterned SiLK (FIGS. 36–37) corroborate the blanket SiLK data, as no change in the morphology (e.g., bowing) is observed between the before treatment sample (FIG. 36) and the after treatment sample (FIG. 37). Again, solution B6 was used in the SEMITOOL apparatus at 50° C. for 10 min.

The recent introduction of copper as the new interconnect material challenges standard processing and requires new strategies. Etching and cleaning steps need to be redesigned in coordination with each other for optimum results. This invention deals with one of the problems encountered during etching: creating residues difficult to remove by any traditional cleaning treatment. The new etching strategy consists of a "2-step etch" process, in which a protecting layer helps to deal with easier to remove residues. A new chemistry has been developed in order to deal with the results of this process flow. This new chemistry, exemplified by solution B6, efficiently cleans post etch residues containing copper, without damaging the metal and with perfect compatibility with SiLK.

3. Photo Resist Stripping

The invention has been tested to remove photoresist on a sample covered with photoresist. The sample in this example is a dual damascene structure etched in a double layer of TEOS. The solutions reported in table 4 were successful in attacking the photoresist in various degrees:

- a concentrated choline hydroxide solution (A5) successfully removed the photoresist (FIGS. 11–12);
- solutions of other choline types, even at low concentration (for example 10% choline chloride [D2], or 3% choline bicarbonate [D20]) have a non-negligible effect at thinning down the photoresist (FIGS. 13–14);
- solutions containing low concentration (2.3% in our example) of choline hydroxide mixed with other solvents such as, for example, dimethyl sulfoxide (DMSO) (solution D4) or monoethanolamine (MEA) (solution D6) have a lift off effect on the photoresist (FIGS. 15–16);
- solutions of choline (hydroxide, chloride, or bicarbonate) can remove the photoresist at high concentrations.

TABLE 4

Photoresist removal evaluation

| Solution | Temperature | time | Stripping Result | |
|---|---|---|---|---|
| A5 | 65° C. | 15 min | P/R removed | FIG. 12 |
| D2 | 65° C. | 15 min | P/R attacked | FIG. 13 |
| D20 | 65° C. | 15 min | P/R attacked | FIG. 14 |
| D4 | 65° C. | 15 min | P/R lift off | FIG. 15 |
| D6 | 65° C. | 15 min | P/R lift off | FIG. 16 |

The addition of a small amount of hydroxylamine in the base solution increases the removal efficiency while keeping the solution compatible with copper. Table 5 shows the results on sample 2, consisting of blanket SiLK film (organic low-k dielectric) with patterned silicon dioxide. The results show that these chemistries can effectively remove the organic resist without damaging the organic dielectric.

TABLE 5

Resist removal results on sample 2
(SiLK ™/SiO2) and copper compatibility of some chemistries

| | Composition | | | | Stripping Results | Compati- |
|---|---|---|---|---|---|---|
| Solution | Hydroxyl amine | Solvent | Base | Water | SiLK/Hard Mask | bility Copper |
| F1 | 0% | 50% | 25% | 25% | ▼ | ✓ |
| F2 | 0% | 50% | 50% | | ▼ | X |
| F3 | 2% | 48% | 12% | 38% | ▼ | ✓ |
| F4 | 5% | 45% | 12% | 38% | ✓ | ✓ |
| F5 | 5% | 48% | 47% | | ▼ | ✓ |
| F6 | 5% | | 5% | 90% | ▼ | ✓ |
| F7 | 5% | | 12% | 83% | ✓ | ✓ |
| F8 | 5% | | 24% | 71% | ✓ | ✓ |

TABLE 5-continued

Resist removal results on sample 2
(SiLK ™/SiO2) and copper compatibility of some chemistries

| | Composition | | | | Stripping Results | Compati- |
|---|---|---|---|---|---|---|
| Solution | Hydroxyl amine | Solvent | Base | Water | SiLK/Hard Mask | bility Copper |
| F9 | 5% | 95% | | | ▼ | ✓ |
| F10 | 5% | 50% | | 45% | ▼ | ✓ |
| F11 | 5% | 48% | 24% | 23% | ✓ | ✓ |
| F12 | 10% | 40% | 12% | 38% | ✓ | ✓ |
| F13 | 13% | 37% | 12% | 38% | ✓ | X |
| F14 | 15% | 35% | 12% | 38% | ✓ | X |
| F15 | 20% | 50% | 30% | | ▼ | X |
| F16 | 25% | | 12% | 63% | ✓ | X |
| F17 | 30% | | 46% | | ☐ | X |
| F18 | 40% | | 60% | | ▼ | X |
| F19 | 50% | | 12% | 38% | ✓ | X |
| F20 | 50% | | 12% | 38% | ✓ | X |

✓ Good
▼ Incomplete
☐ Not Tested
X Incompatible

Solvents can be dimethyl acetamide (DMAc), DMSO, propylene glycol (PG), dipropylene glycol monomethyl ether (DPM), N-methyl pyrrolidone (NMP), or cyclohexyl pyrrolidone (CHP), while the bases consist of morpholine, MEA, diethanolamine, diglycolamine, choline bicarbonate, tetramethyl ammonium hydroxide (TMAH), or choline hydroxide.

A chemistry composed of 2% to 12% of hydroxylamine with a strong base such as a quaternary ammonium hydroxide compound can be used to remove tough resist on inorganic substrate with an organic material exposed. The chemistry is compatible with both copper and the organic material.

4. Residue Removal After Metal Etch

The invention has been tested for removing polymer after metal etch. The metal etched in our example is an aluminum line, with post etch residues (FIG. 17) relatively easy to clean. A dilute solution of choline bicarbonate (3% [D20] to 5% [D21]) successfully removes this polymer at room temperature, with treatment for about 5 minutes (table 6 and FIG. 18). However we anticipate that tougher residues will require either higher temperature or higher concentration of the solution to be removed efficiently. Either way, care is required to maintain compatibility with the aluminum or aluminum alloy line.

TABLE 6 efficiency of post etch residue removal after metal etch

| Solution | Temperature | time | Cleaning Results | |
|---|---|---|---|---|
| D20 | 25° C. | 5 min | good | FIG. 18 |
| D21 | 25° C. | 5 min | good | no figure |

5. Residue Removal After Via Etch

TABLE 7 efficiency of post via etch residues removal.

| Solution | Temperature | time | Cleaning Results | |
|---|---|---|---|---|
| D4 | 65° C. | 15 min | Good | no figure |
| D5 | 65° C. | 15 min | Good | no figure |
| D6 | 65° C. | 15 min | Good | no figure |
| D7 | 65° C. | 15 min | Good | no figure |
| D8 | 65° C. | 15 min | Good | no figure |
| D9 | 65° C. | 15 min | Good | no figure |

The invention has been tested for removing polymer after via etch. Dilute solutions of choline hydroxide (2% to 5%) with or without added solvents, such as, for example DMSO (solutions D4 and D5) or MEA (solutions D6 and D7) successfully clean residues from via samples (table 7). Those solutions give good results at cleaning dielectric substrate, but underlying aluminum lines are subject to attack due to the higher temperature used here.

6. Corrosion of Misaligned Tungsten Plug

The invention has been tested on a sample where misaligned tungsten plugs are corroded by conventional amine cleaner (FIG. 19). We can successfully clean the sample without damaging the plug by using a dilute solution of choline bicarbonate (3% [D20] to 5% [D21]) as a rinse at room temperature for about 5 minutes prior to using the conventional amine cleaner (FIGS. 20 and 21). Furthermore we show in FIG. 22 that adding a small amount (3%) of choline bicarbonate into the conventional cleaner slows down the attack of the exposed plug by the conventional amine system. The use of those solutions as an intermediate rinse between the photoresist removal step and the conventional solvent step avoids corrosion of misaligned tungsten plugs, especially in a case such as the present one where the post metal etch residue is relatively easy to remove.

TABLE 8

Evaluation of tungsten plug corrosion

| Solution | Temperature | Time | line corrosion | plug corrosion | |
|---|---|---|---|---|---|
| D20 | Rt | 5 min | no corrosion | no corrosion | FIG. 20 |
| D21 | Rt | 5 min | no corrosion | no corrosion | FIG. 21 |
| D26 | 65° C. | 15 min | no corrosion | reduced attack | FIG. 22 |

Solution Summary

| Solution | choline hydroxide concentration | water concentration | Propylene Glycol concentration | Other (Benzo-triazole) |
|---|---|---|---|---|
| A1 | 0% | 100% | | |
| A2 | 5% | 95% | | |
| A3 | 10% | 90% | | |
| A4 | 20% | 80% | | |
| A5 | 50% | 50% | | |
| B1 | 15% | (70 + 15)% | 0% | |
| B2 | 20% | (60 + 20)% | 0% | |
| B3 | 25% | (50 + 25)% | 0% | |
| B4 | 20% | (10 + 20)% | 50% | |
| B5 | 20% | (35 + 20)% | 25% | |
| B6 | 25% | 25% | 50% | |
| C1 | 20% | (20 + 20)% | 40% | |
| C2 | 10% | (30 + 10)% | 50% | |
| C3 | 10% | (79 + 10)% | | 1% BTA |
| C4 | 10% | (29 + 10)% | 50% | 1% BTA |
| C6 | 20% | (20 + 59.5)% | | 0.5% BTA |

| Solution | TMAH concentration | Water concentration | Propylene Glycol concentration | Propylene Carbonate |
|---|---|---|---|---|
| C8 | 25% | 75% | | |
| C9 | 12.50% | 12.50% | 50% | |
| C10 | 12.50% | 12.50% | | 50% |

| Solution | Choline hydroxide | Choline bicarbonate | Choline chloride | Water | Solvent(s) | corr. inhib. |
|---|---|---|---|---|---|---|
| D2 | | 10% | | 90% | | |
| D3 | | 20% | | 80% | | |
| D4 | 2.30% | | | 47.70% | 50% DMSO | |
| D5 | 1.19% | | | 45.32% | 47.5% DMSO | 5% cat |
| D6 | 2.30% | | | 47.70% | 50% MEA | |
| D7 | 1.19% | | | 45.32% | 47.5% MEA | 5% cat |
| D8 | 4.60% | | | 95.40% | | |
| D9 | 4.37% | | | 90.63% | | 5% cat |
| D10 | 4.60% | | | 94.90% | | 0.5% BTA |
| D11 | 4.60% | | | 94.40% | | 1% TBC |
| D12 | 4.60% | | | 90.40% | | 5% TBC |
| D13 | 2.50% | | | 97.50% | | |
| D14 | 20% | | | 30% | 50% PG | |
| D15 | 10% | | | 40% | 50% PG | |
| D16 | 2% | | | 48% | 50% PG | |
| D17 | 20% | | | 20% | 60% PG | |
| D18 | 12.50% | | | 12.50% | 75% PG | |
| D19 | | 75% | | 25% | | |
| D20 | | 3% | | 97% | | |
| D21 | | 5% | | 95% | | |
| D22 | 37.50% | | | 12.50% | 50% PG | |
| D23 | 18.75% | | | 56.25% | 25% PG | |
| D24 | 3.75% | | | 46.25% | 50% PG | |
| D25 | 3.75% | | 1.25% | | 95% PG | |
| D26 | 2% | | | 17.15% | 17.15% HYDROXYLAMINE; 58.8% DGA | 4.9% cat |

| Solution | Composition | Name |
|---|---|---|
| E1 | NMP | N-methyl pyrrolidone |
| E2 | BLO | gamma butyrolactone |
| E3 | DPM acetate | Dipropyleneglycol monomethyl ether |
| E4 | morpholine | |
| E5 | DGA | Diglycol amine |
| E6 | 85% BLO + 15% NMP | |
| E7 | 50% DGA + 50% NMP | |
| E8 | 50% Morpholine + 35% NMP + 15% BLO | |
| E9 | DPM | |
| E10 | propylene carbonate | |
| E11 | DMSO | Dimethyl sulfoxide |
| E12 | DMF | Dimethyl formate |
| E13 | propylene glycol | |
| E14 | dimethylacetamide | |
| E15 | TETA | Tri(ethylene) tetraamine |
| E16 | TETA + 5% ammonium bicarbonate. | |
| E17 | TETA + 1% ammonium bicarbonate. | |
| E20 | TETA + 5% catechol | |
| E21 | TETA + 1% BTA | Benzotriazole |
| E22 | TEA | Triethanolamine |
| E23 | TEA + 5% ammonium bicarbonate. | |
| E24 | TEA + 1% ammonium bicarbonate. | |
| E27 | TEA + 5% catechol | |
| E28 | TEA + 1% BTA | |
| E29 | MEA | Monoethanolamine |
| E30 | MEA + 5% ammonium bicarbonate. | |
| E31 | MEA + 1% ammonium bicarbonate. | |
| E34 | MEA + 5% catechol | |
| E35 | MEA + 1% BTA | |
| E36 | 8% Citric acid + 3.2% | |

-continued

HYDROXYLAMINE + 0.5%
BTA + 88.3% water cat = catechol
TBC = t-butyl catechol

In summary, these tests demonstrate a new chemistry, exemplified by composition B6 in the above tables, which has a negligible etch rate on copper and other metal used for copper integration (FIG. 23). It is perfectly compatible with SiLK and some other low-k materials (FIG. 24) and at the same time, gently removes residues containing copper.

It should further be apparent to those skilled in the art that various changes in form and details of the invention as shown and described may be made.

What is claimed is:

1. A composition for the removal of etch residues from integrated circuits using copper materials, which consists essentially of:
    a choline compound;
    water;
    an organic solvent selected from the group consisting of dimethyl sulfoxide, dimethyl acetamide, ethylene glycol, ethylene glycol alkyl ether, diethylene glycol alkyl ether, triethylene glycol alkyl ether, propylene glycol, propylene glycol alkyl ether, N-methyl pyrrolidone, ethylene diamine, ethylene triamine, monoethanolamine, and diglycolamine; and
    from about 0.5% by weight to about 5% by weight of a corrosion inhibitor selected from the group consisting of:
    compounds of the general class

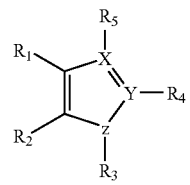

where X, Y, and Z, are chosen from C, N, O, S, and P; and where pendant R groups $R_1$–$R_5$ are chosen from H, a substituted $C_1$–$C_6$ straight, branched or cyclo alkyl, alkenyl or alkynyl group, straight or branched alkoxy group, a substituted acyl group, amidyl group, hydroxyl group, a halogen, carboxyl group, alkoxyalkyl group, alkylamino group, alkylsulfonyl group, and sulfonic acid group;
    salts of said compounds of the general class;
    hydroxybenezene compounds of the general class

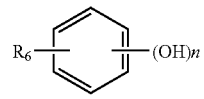

where n=1–4, and
where $R_6$ is present from 2 to 5 times and is chosen from H, a substituted $C_1$–$C_6$ straight, branched or cyclo alkyl, alkenyl or alkynyl group, straight or branched alkoxy group, a substituted acyl group, amidyl group, a halogen, carboxyl group, alkoxyalkyl group, alkylamino group, alkylsulfonyl group, sulfonic acid group; and
    salts of said hydroxybenezene compounds,
    wherein X is carbon and Y is nitrogen or X is nitrogen and Y is carbon, Z is nitrogen, and $R_1$–$R_5$ are hydrogen.

2. A composition for the removal of etch residues from integrated circuits using copper materials, which consists essentially of:
    a choline compound;
    water;
    an organic solvent selected from the group consisting of dimethyl sulfoxide, dimethyl acetamide, ethylene glycol, ethylene glycol alkyl ether, diethylene glycol alkyl ether, triethylene glycol alkyl ether, propylene glycol, propylene glycol alkyl ether, N-methyl pyrrolidone, ethylene diamine, ethylene triamine, monoethanolamine. and diglycolamine; and
    from about 0.5% by weight to about 5% by weight of a corrosion inhibitor selected from the group consisting of:
    compounds of the general class

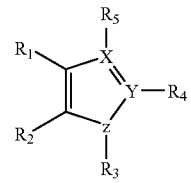

where X, Y, and Z, are chosen from C, N, O, S, and P; and where pendant R groups $R_1$–$R_5$ are chosen from H, a substituted $C_1$–$C_6$ straight, branched or cyclo alkyl, alkenyl or alkynyl group, straight or branched alkoxy group, a substituted acyl group, amidyl group, hydroxyl group, a halogen, carboxyl group, alkoxyalkyl group, alkylamino group, alkylsulfonyl group, and sulfonic acid group;
    salts of said compounds of the general class;
    hydroxybenezene compounds of the general class

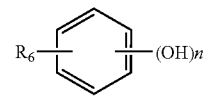

where n=1–4, and
where $R_6$ is present from 2 to 5 times and is chosen from H, a substituted $C_1$–$C_6$ straight, branched or cyclo alkyl, alkenyl or alkynyl group, straight or branched alkoxy group, a substituted acyl group, amidyl group, a halogen, carboxyl group, alkoxyalkyl group, alkylamino group, alkylsulfonyl group, sulfonic acid group; and
    salts of said hydroxybenezene compounds,
    wherein X is carbon and Y is nitrogen or X is nitrogen and Y is carbon, Z is nitrogen, $R_3$ is hydrogen, and $R_4$ and $R_5$ constitute a benzene ring.

3. A composition for the removal of etch residues from integrated circuits using copper materials and low k dielectric materials consisting essentially of:
    a choline compound;
    water;
    from about 2 to about 12% by weight of hydroxylamine or hydroxlamine salt;
    an organic solvent selected from the group consisting of dimethyl sulfoxide, dimethyl acetamide, ethylene glycol, ethylene glycol alkyl ether, diethylene glycol alkyl ether, triethylene glycol alkyl ether, propylene glycol, propylene glycol alkyl ether, N-methyl pyrrolidone, ethylene diamine, ethylene triamine, monoethanolamine. and diglycolamine; and from about 0.5% by weight to about 5% by weight of a corrosion inhibitor selected from the group consisting of:

compounds of the general class

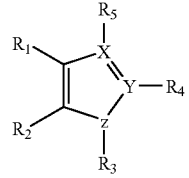

where X, Y, and Z, are chosen from C, N, O, S, and P; and where pendant R groups $R_1$–$R_5$ are chosen from H, a substituted $C_1$–$C_6$ straight, branched or cyclo alkyl, alkenyl or alkynyl group, straight or branched alkoxy group, a substituted acyl group, amidyl group, hydroxyl group, a halogen, carboxyl group, alkoxyalkyl group, alkylamino group, alkylsulfonyl group, and sulfonic acid group;

salts of said compounds of the general class;
hydroxybenzene compounds of the general class

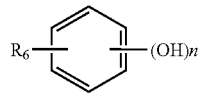

where n=1–4, and
where $R_6$ is present from 2 to 5 times and is chosen from H, a substituted $C_1$–$C_6$ straight, branched or cyclo alkyl, alkenyl or alkynyl group, straight or branched alkoxy group, a substituted acyl group, amidyl group, a halogen, carboxyl group, alkoxyalkyl group, alkylamino group, alkylsulfonyl group, sulfonic acid group; and salts of said hydroxybenezene compounds,
wherein X is carbon and Y is nitrogen or X is nitrogen and Y is carbon, Z is nitrogen, and $R_1$–$R_5$ are hydrogen.

4. A composition for the removal of etch residues from integrated circuits using copper materials and low k dielectric materials consisting essentially of:
a choline compound;
water;
from about 2 to about 12% by weight of hydroxylamine or hydroxlamine salt;
an organic solvent selected from the group consisting of dimethyl sulfoxide, dimethyl acetamide, ethylene glycol, ethylene glycol alkyl ether, diethylene glycol alkyl ether, triethylene glycol alkyl ether, propylene glycol, propylene glycol alkyl ether, N-methyl pyrrolidone, ethylene diamine, ethylene triamine, monoethanolamine. and diglycolamine; and
from about 0.5% by weight to about 5% by weight of a corrosion inhibitor selected from the group consisting of:

compounds of the general class

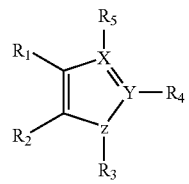

where X, Y, and Z, are chosen from C, N, O, S, and P; and where pendant R groups $R_1$–$R_5$ are chosen from H, a substituted $C_1$–$C_6$ straight, branched or cyclo alkyl, alkenyl or alkynyl group, straight or branched alkoxy group, a substituted acyl group, amidyl group, hydroxyl group, a halogen, carboxyl group, alkoxyalkyl group, alkylamino group, alkylsulfonyl group, and sulfonic acid group;

salts of said compounds of the general class;
hydroxybenzene compounds of the general class

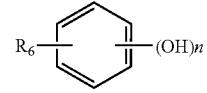

where n=1–4, and
where $R_6$ is present from 2 to 5 times and is chosen from H, a substituted $C_1$–$C_6$ straight, branched or cyclo alkyl, alkenyl or alkynyl group, straight or branched alkoxy group, a substituted acyl group, amidyl group, a halogen, carboxyl group, alkoxyalkyl group, alkylamino group, alkylsulfonyl group, sulfonic acid group; and salts of said hydroxybenezene compounds,
wherein X is carbon and Y is nitrogen or X is nitrogen and Y is carbon, Z is nitrogen, $R_3$ is hydrogen, and $R_4$ and $R_5$ constitute a benzene ring.

5. A composition for stripping photoresist from integrated cirucits using copper materials and low k dielectric materials consisting essentially of:
a choline compound;
water;
from about 2 to about 12% by weight of hydroxylamine or hydroxlamine salt;
an organic solvent selected from the group consisting of dimethyl sulfoxide, dimethyl sulfoxide, propylene glycol, dipropylene glycol monomethyl ether, N-methyl pyrrolidone, and cyclohexyl pyrrolidone; and
from about 0.5% by weight to about 5% by weight of a corrosion inhibitor selected from the group consisting of:

compounds of the general class

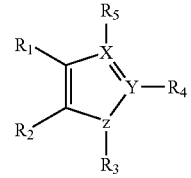

where X, Y, and Z, are chosen from C, N, O, S, and P; and where pendant R groups $R_1$–$R_5$ are chosen from H, a substituted $C_1$–$C_6$ straight, branched or cyclo alkyl, alkenyl or alkynyl group, straight or branched alkoxy group, a substituted acyl group, amidyl group, hydroxyl group, a halogen, carboxyl group, alkoxyalkyl group, alkylamino group, alkylsulfonyl group, and sulfonic acid group;

salts of said compounds of the general class;
hydroxybenzene compounds of the general class

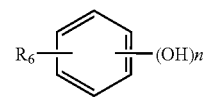

where n=1–4, and
where $R_6$ is present from 2 to 5 times and is chosen from H, a substituted $C_1$–$C_6$ straight, branched or cyclo alkyl, alkenyl or alkynyl group, straight or branched alkoxy group, a substituted acyl group, amidyl group, a halogen, carboxyl group, alkoxyalkyl group, alkylamino group, alkylsulfonyl group, sulfonic acid group; and salts of said hydroxybenezene compounds, wherein X is carbon and Y is nitrogen or X is nitrogen and Y is carbon, Z is nitrogen, and $R_1$–$R_5$ are hydrogen.

6. A composition for stripping photoresist from integrated cirucits using copper materials and low k dielectric materials consisting essentially of:

a choline compound;
water;
from about 2 to about 12% by weight of hydroxylamine or hydroxlamine salt;
an organic solvent selected from the group consisting of dimethyl sulfoxide, dimethyl sulfoxide, propylene glycol, dipropylene glycol monomethyl ether, N-methyl pyrrolidone, and cyclohexyl pyrrolidone; and
from about 0.5% by weight to about 5% by weight of a corrosion inhibitor selected from the group consisting of:
compounds of the general class

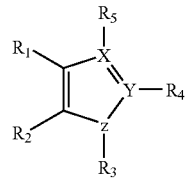

where X, Y, and Z, are chosen from C, N, O, S, and P; and where pendant R groups $R_1$–$R_5$ are chosen from H, a substituted $C_1$–$C_6$ straight, branched or cyclo alkyl, alkenyl or alkynyl group, straight or branched alkoxy group, a substituted acyl group, amidyl group, hydroxyl group, a halogen, carboxyl group, alkoxyalkyl group, alkylamino group, alkylsulfonyl group, and sulfonic acid group;

salts of said compounds of the general class;

hydroxybenzene compounds of the general class

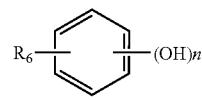

where n=1–4, and where $R_6$ is present from 2 to 5 times and is chosen from H, a substituted $C_1$–$C_6$ straight, branched or cyclo alkyl, alkenyl or alkynyl group, straight or branched alkoxy group, a substituted acyl group, amidyl group, a halogen, carboxyl group, alkoxyalkyl group, alkylamino group, alkylsulfonyl group, sulfonic acid group; and salts of said hydroxybenezene compounds, wherein X is carbon and Y is nitrogen or X is nitrogen and Y is carbon, Z is nitrogen, $R_3$ is hydrogen, and $R_4$ and $R_5$ constitute a benzene ring.

* * * * *

UNITED STATES PATENT AND TRADEMARK OFFICE
CERTIFICATE OF CORRECTION

PATENT NO. : 7,157,415 B2  Page 1 of 1
APPLICATION NO. : 10/007134
DATED : January 2, 2007
INVENTOR(S) : Peyne et al.

It is certified that error appears in the above-identified patent and that said Letters Patent is hereby corrected as shown below:

Col. 20, line 25 change "cirucits" to --circuits--;

Col. 20, line 32 change "dimethyl sulfoxide, dimethyl sulfoxide" to --dimethyl acetamide, dimethyl sulfoxide-- .

Col. 21, line 6 change "cirucits" to --circuits--;

Col. 21, line 14 change "dimethyl sulfoxide, dimethyl sulfoxide" to --dimethyl acetamide, dimethyl sulfoxide--.

Signed and Sealed this

Eighth Day of May, 2007

JON W. DUDAS
*Director of the United States Patent and Trademark Office*